(12) United States Patent
Sasayama

(10) Patent No.: US 12,295,187 B2
(45) Date of Patent: *May 6, 2025

(54) SEMICONDUCTOR WAFER, SEMICONDUCTOR DEVICE, AND GAS CONCENTRATION MEASURING DEVICE

(71) Applicant: Asahi Kasei Microdevices Corporation, Tokyo (JP)

(72) Inventor: Kengo Sasayama, Tokyo (JP)

(73) Assignee: Ashai Kasei Microdevices Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/679,941

(22) Filed: May 31, 2024

(65) Prior Publication Data

US 2024/0322085 A1  Sep. 26, 2024

Related U.S. Application Data

(63) Continuation of application No. 17/198,476, filed on Mar. 11, 2021, now Pat. No. 12,034,101.

(30) Foreign Application Priority Data

Mar. 11, 2020  (JP) .................................. 2020-041973

(51) Int. Cl.
*H01L 33/00* (2010.01)
*G01N 21/3504* (2014.01)
(Continued)

(52) U.S. Cl.
CPC ......... *H10H 20/84* (2025.01); *G01N 21/3504* (2013.01); *H10H 20/824* (2025.01)

(58) Field of Classification Search
None
See application file for complete search history.

(56) References Cited

U.S. PATENT DOCUMENTS 5,138,485 A   8/1992  Ishida et al.
7,901,870 B1  3/2011  Wach
(Continued)

FOREIGN PATENT DOCUMENTS

EP    1557479 A1   7/2005
JP    2000260760 A  9/2000
(Continued)

*Primary Examiner* — Nicholas J Tobergte
(74) *Attorney, Agent, or Firm* — KENJA IP LAW PC

(57) ABSTRACT

Provided are a semiconductor wafer, a semiconductor device, and a gas concentration measuring device having a size reduced by reducing warpage to be even smaller than the sizes that can be achieved by conventional techniques. The semiconductor wafer includes: a wafer substrate, a semiconductor stacked portion formed on a first surface of the wafer substrate, the semiconductor stacked portion being capable of emitting or receiving infrared light of 2 μm to 10 μm; and an optical filter formed on a second surface of the wafer substrate that is opposite to the first surface of the wafer substrate. The thickness $T_{waf}$ [μm] of the wafer substrate and the thickness $T_{opt}$ [μm] of the optical filter satisfy the relation of $T_{opt} \leq 0.000053 \times T_{waf}^{2.0488}$.

16 Claims, 20 Drawing Sheets

(51) Int. Cl.
*H10H 20/824* (2025.01)
*H10H 20/84* (2025.01)

(56) References Cited

U.S. PATENT DOCUMENTS

| | | |
|---|---|---|
| 9,691,803 B2 | 6/2017 | Uematsu et al. |
| 12,034,101 B2 * | 7/2024 | Sasayama ............... H01L 33/44 |
| 2002/0005524 A1 | 1/2002 | Kato et al. |
| 2006/0222575 A1 | 10/2006 | Chen |
| 2007/0242177 A1 | 10/2007 | Lee et al. |
| 2014/0138784 A1 | 5/2014 | Dyer et al. |
| 2015/0279887 A1 | 10/2015 | Uematsu et al. |
| 2022/0403136 A1 | 12/2022 | Kim et al. |

FOREIGN PATENT DOCUMENTS

| | | |
|---|---|---|
| JP | 2002033503 A | 1/2002 |
| JP | 2003177238 A | 6/2003 |
| JP | 2010133946 A | 6/2010 |
| JP | 2016090377 A | 5/2016 |
| JP | 2017175006 A | 9/2017 |
| JP | 2018060919 A | 4/2018 |
| WO | 2004038061 A1 | 5/2004 |

* cited by examiner

FIG. 3
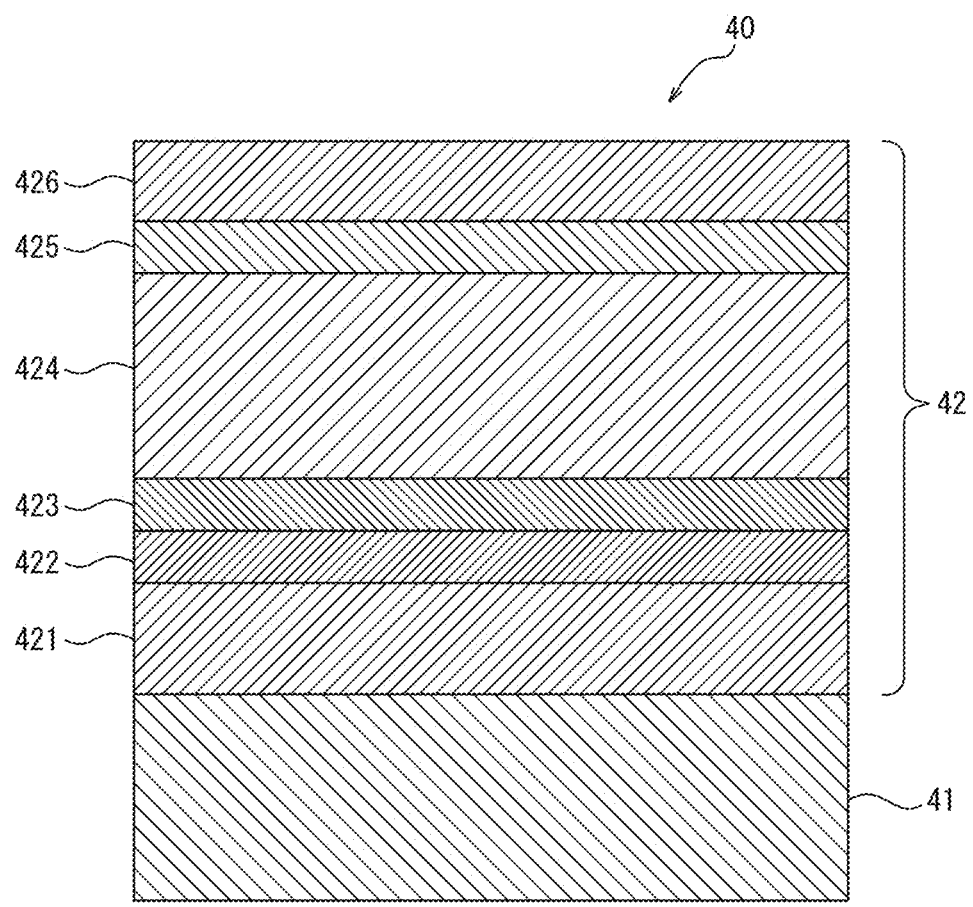
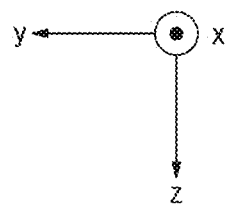

FIG. 10

| Material | Thickness nm |
|---|---|
| SiO | 199 |
| Ge | 234 |
| SiO | 519 |
| Ge | 561 |
| SiO | 506 |
| Ge | 312 |
| SiO | 475 |
| Ge | 344 |
| SiO | 437 |
| Ge | 654 |
| SiO | 359 |
| Ge | 186 |
| SiO | 392 |
| Ge | 193 |
| SiO | 344 |
| Ge | 201 |
| SiO | 212 |
| Ge | 87 |
| SiO | 11 |
| Ge | 54 |
| SiO | 618 |
| Ge | 20 |
| SiO | 54 |
| Ge | 143 |
| SiO | 165 |
| Ge | 151 |
| SiO | 123 |
| Ge | 152 |
| SiO | 128 |
| Back side of semiconductor wafer | |
| Total thickness of filter portion | 7835 |

FIG. 12

| Material | Thickness nm |
|---|---|
| SiO | 91 |
| Ge | 375 |
| SiO | 381 |
| Ge | 536 |
| SiO | 523 |
| Ge | 394 |
| SiO | 475 |
| Ge | 333 |
| SiO | 345 |
| Ge | 699 |
| SiO | 186 |
| Ge | 257 |
| SiO | 410 |
| Ge | 276 |
| SiO | 135 |
| Ge | 214 |
| SiO | 226 |
| Ge | 119 |
| SiO | 11 |
| Ge | 66 |
| SiO | 39 |
| Ge | 19 |
| SiO | 51 |
| Ge | 90 |
| SiO | 104 |
| Ge | 140 |
| SiO | 66 |
| Ge | 109 |
| SiO | 108 |
| Si substrate : 150000nm ||
| Back side of semiconductor wafer ||
| Total thickness of filter portion | 6778 |

FIG. 14

| Material | Thickness nm |
|---|---|
| SiO | 103 |
| Ge | 149 |
| SiO | 241 |
| Ge | 503 |
| SiO | 297 |
| Ge | 236 |
| SiO | 290 |
| Ge | 250 |
| SiO | 265 |
| Ge | 529 |
| SiO | 216 |
| Ge | 173 |
| SiO | 238 |
| Ge | 309 |
| SiO | 230 |
| Ge | 157 |
| SiO | 170 |
| Ge | 197 |
| SiO | 171 |
| Ge | 134 |
| SiO | 152 |
| Ge | 15 |
| SiO | 119 |
| Ge | 110 |
| SiO | 153 |
| Ge | 176 |
| SiO | 154 |
| Back side of semiconductor wafer | |
| Total thickness of filter portion | 5738 |

FIG. 16

| Material | Thickness nm |
|---|---|
| ZnS | 738 |
| Ge | 392 |
| ZnS | 745 |
| Ge | 415 |
| ZnS | 700 |
| Ge | 462 |
| ZnS | 700 |
| Ge | 453 |
| ZnS | 867 |
| Ge | 436 |
| ZnS | 570 |
| Ge | 329 |
| ZnS | 531 |
| Ge | 324 |
| ZnS | 558 |
| Ge | 333 |
| ZnS | 568 |
| Ge | 320 |
| ZnS | 471 |
| Ge | 284 |
| ZnS | 421 |
| Ge | 259 |
| ZnS | 349 |
| Ge | 195 |
| ZnS | 390 |
| Ge | 234 |
| ZnS | 377 |
| Ge | 222 |
| ZnS | 325 |
| Ge | 169 |
| ZnS | 314 |
| Ge | 173 |
| ZnS | 297 |
| Ge | 173 |
| ZnS | 291 |
| Ge | 189 |
| ZnS | 312 |
| Ge | 171 |
| ZnS | 279 |
| Ge | 172 |
| ZnS | 275 |
| Ge | 173 |
| Si substrate : 150000nm | |
| Back side of semiconductor wafer | |
| Total thickness of filter portion | 15961 |

FIG. 20

| Material | Thickness nm |
|---|---|
| SiO | 20 |
| Ge | 220 |
| SiO | 443 |
| Ge | 352 |
| SiO | 375 |
| Ge | 181 |
| SiO | 295 |
| Ge | 178 |
| SiO | 378 |
| Ge | 279 |
| SiO | 391 |
| Ge | 187 |
| SiO | 63 |
| Ge | 211 |
| SiO | 333 |
| Back side of semiconductor wafer | |
| Total thickness of filter portion | 3906 |

SEMICONDUCTOR WAFER, SEMICONDUCTOR DEVICE, AND GAS CONCENTRATION MEASURING DEVICE

CROSS-REFERENCE TO RELATED APPLICATIONS

The present application is a continuation application of U.S. patent application Ser. No. 17/198,476 filed Mar. 11, 2021, which claims priority of Japanese Patent Application No. 2020-041973 filed Mar. 11, 2020. The disclosures of the prior applications are hereby incorporated by reference herein in their entirety.

TECHNICAL FIELD

The present disclosure relates to a semiconductor wafer, a semiconductor device, and a gas concentration measuring device.

BACKGROUND

In recent years, various types of electronic devices are required to be even smaller. Accordingly, semiconductor devices mounted on electronic devices are also required to be smaller. Examples of the semiconductor device include, for example, infrared light receiving devices receiving infrared light and infrared light emitting devices emitting infrared light. Further, examples of making a semiconductor device smaller includes, for example, reducing the area on which the semiconductor device is mounted, and reducing the size of the device in the thickness direction (reducing the height), etc.

For example, JP 2016-090377 A (PTL 1) discloses a technique of placing a substrate between a lens and an infrared light receiving element thereby obtaining an infrared light receiving device that is smaller as compared with devices in which a lens and an infrared light receiving element are arranged on one side of a substrate.

CITATION LIST

Patent Literature

PTL 1: JP 2016-090377 A

SUMMARY

Here, for an infrared light receiving device or an infrared light emitting device, an optical filter (hereinafter simply referred to as a "filter") is used to emit or receive light of a certain wavelength band. The filter typically has a multilayer structure, and warpage would occur in the filter, and when the size of an element is smaller, the influence caused by the warpage is more significant. The warpage is significantly likely to occur when a wafer has a plurality of elements. Further, since an infrared filter has a thickness larger than that of a visible filter, stress applied to the infrared filter is high and the influence due to warpage is greater. For example, even if an infrared filter is used instead of the lens in the technique of PTL 1, the warpage of the filter has a strong influence around openings in the substrate, and the stress reaches the infrared light receiving element. In this way, it has been difficult to obtain smaller semiconductor wafers and semiconductor devices that include an infrared filter.

It could be helpful to provide a semiconductor wafer and a semiconductor device that have a reduced size with reduced warpage.

A semiconductor wafer according to an aspect of the present disclosure includes:
  a wafer substrate;
  a semiconductor stacked portion formed on a first surface of the wafer substrate, the semiconductor stacked portion being capable of one of emitting and receiving infrared light of 2 µm to 10 µm; and
  an optical filter formed on a second surface of the wafer substrate that is opposite to the first surface of the wafer substrate.

A thickness $T_{waf}$ [µm] of the wafer substrate and a thickness $T_{opt}$ [µm] of the optical filter satisfy relations of $T_{opt} \geq 4$ and $T_{opt} \leq 0.000053 \times T_{waf}^{2.0488}$.

A semiconductor wafer according to an aspect of the present disclosure includes:
  a wafer substrate;
  a semiconductor stacked portion formed on a first surface of the wafer substrate, the semiconductor stacked portion being capable of one of emitting and receiving infrared light; and
  an optical filter formed on a second surface of the wafer substrate that is opposite to the first surface.

An interlayer made of Si with a thickness of 50 µm or more and 300 µm or less is provided between the optical filter and the wafer substrate, and a thickness of the optical filter is 10% or less of a thickness of the wafer substrate.

A semiconductor device according to an aspect of the present disclosure includes:
  a substrate;
  a semiconductor stacked portion formed on a first surface of the substrate, the semiconductor stacked portion being capable of one of emitting and receiving infrared light of 2 µm to 10 µm;
  an optical filter formed on a second surface of the substrate that is opposite to the first surface of the substrate; and
  a sealed portion in which the substrate, the semiconductor stacked portion, and the optical filter are sealed so that at least part of the optical filter is exposed.

A thickness $T_{sub}$ [µm] of the substrate and a thickness $T_{opt}$ [µm] of the optical filter satisfy relations of $T_{opt} \geq 4$ and $T_{opt} \leq 0.000053 \times T_{sub}^{2.0488}$.

A semiconductor device according to an aspect of the present disclosure includes:
  a substrate having a thickness of $T_{sub}$ [µm];
  a semiconductor stacked portion formed on a first surface of the substrate, the semiconductor stacked portion being capable of one of emitting and receiving infrared light; and
  an optical filter with a thickness of $T_{opt}$ [µm] formed on a second surface of the substrate that is opposite to the first surface.

An interlayer made of Si with a thickness of 50 µm or more and 300 µm or less is provided between the optical filter and the substrate, and a thickness of the optical filter is 10% or less of a thickness of the substrate.

A gas concentration measuring device according to an aspect of the present disclosure includes:
  a light emitting unit outputting infrared light absorbed by a gas to be detected;
  a gas cell into which the gas to be detected is introduced; and
  a light receiving unit that receives infrared light having been outputted from the light emitting unit and transmitted through the gas cell, and outputs a signal depending on an amount of the received infrared light.

At least one of the light emitting unit and the light receiving unit is the semiconductor device according to any one of the above devices.

The present disclosure can provide a semiconductor wafer, a semiconductor device, and a gas concentration measuring device having a size reduced by reducing warpage to be even smaller than the sizes that can be achieved by conventional techniques.

BRIEF DESCRIPTION OF THE DRAWINGS

In the accompanying drawings:

FIG. 3 is a cross-sectional view of a light emitting/receiving element;

FIG. 10 is a diagram illustrating the structure of an optical filter of Example 1;

FIG. 12 is a diagram illustrating the structure of an optical filter of Example 2;

FIG. 14 is a diagram illustrating the structure of an optical filter of Example 3;

FIG. 16 is a diagram illustrating the structure of an optical filter of Example 4;

FIG. 20 is a diagram illustrating the structure of an optical filter of Example 8.

DETAILED DESCRIPTION

Figure 1:
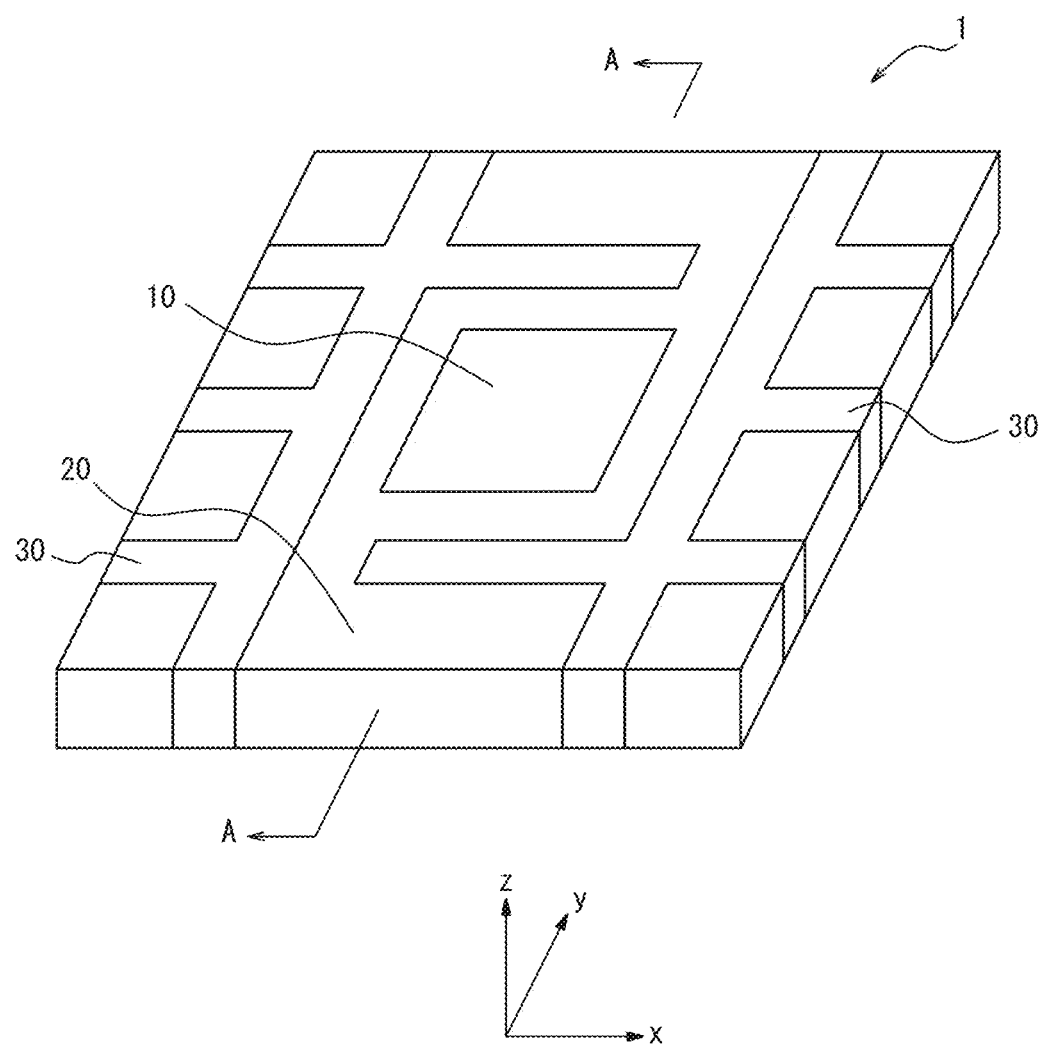
FIG. 1 is an external perspective view schematically illustrating the structure of a semiconductor device according to one embodiment of the present disclosure.

Embodiments of the present disclosure are described below.

<Semiconductor Wafer>
<Semiconductor Wafer of First Embodiment>

A semiconductor wafer according to a first embodiment of the present disclosure includes: a wafer substrate, a semiconductor stacked portion formed on a first surface of the wafer substrate, the semiconductor stacked portion being capable of emitting or receiving infrared light of 2 µm to 10 µm; and an optical filter formed on a second surface of the wafer substrate that is opposite to the first surface of the wafer substrate. The thickness $T_{waf}$ [µm] of the wafer substrate and the thickness $T_{opt}$ [µm] of the optical filter satisfy the relations of $T_{opt} \geq 4$ and $T_{opt} \leq 0.000053 \times T_{waf}^{2.0488}$.

For the semiconductor wafer of the first embodiment, the warpage of the semiconductor wafer can be sufficiently reduced because the thickness $T_{waf}$ [µm] of the wafer substrate and the thickness $T_{opt}$ [µm] of the optical filter satisfy the relations of $T_{opt} \geq 4$ and $T_{opt} \leq 0.000053 \times T_{waf}^{2.0488}$.

In terms of sufficiently reducing the warpage of the semiconductor wafer, the thickness $T_{waf}$ of the wafer substrate of the first embodiment is preferably 240 µm to 600 µm.

In terms of sufficiently reducing the warpage of the semiconductor wafer, the thickness $T_{opt}$ of the optical filter in the semiconductor wafer of the first embodiment is preferably 4 µm to 26 µm.

<Semiconductor Wafer of Second Embodiment>

A semiconductor wafer according to a second embodiment of the present disclosure includes: a wafer substrate; a semiconductor stacked portion formed on a first surface of the wafer substrate, the semiconductor stacked portion being capable of emitting or receiving infrared light; and an optical filter formed on a second surface of the wafer substrate that is opposite to the first surface. An interlayer made of Si with a thickness of 50 µm or more and 300 µm or less is provided between the optical filter and the wafer substrate, and the thickness of the optical filter is 10% or less of the thickness of the wafer substrate.

For the semiconductor wafer of the second embodiment, the warpage of the semiconductor wafer can be sufficiently reduced because the interlayer made of Si with a thickness of 50 µm or more and 300 µm or less is provided between the optical filter and the wafer substrate, and the thickness of the optical filter is 10% or less of the thickness of the wafer substrate.

In terms of sufficiently reducing the warpage of the semiconductor wafer, the thickness $T_{opt}$ of the optical filter in the semiconductor wafer of the second embodiment is preferably 1.5 µm to 60 µm.

In terms of avoiding chipping in dicing, for the semiconductor wafers of the first and second embodiments, the amount of wafer warpage that is defined by the difference between the heights of the wafer center and the outermost wafer periphery is preferably 300 µm or less.

The interlayer in the semiconductor wafer of the second embodiment preferably has a thickness of 50 µm or more and 300 µm or less, preferably 75 µm or more and 250 µm or less, still more preferably 100 µm or more and 200 µm or less. The semiconductor wafer is not limited as long as the semiconductor wafer is made of Si. Examples include a Si substrate in which both surfaces have been mirror-polished.

<Semiconductor Device>
<Semiconductor Device of First Embodiment>

A semiconductor device according to a first embodiment of the present disclosure includes: a substrate; a semiconductor stacked portion formed on a first surface of the substrate, the semiconductor stacked portion being capable of emitting or receiving infrared light of 2 μm to 10 μm; an optical filter formed on a second surface of the substrate that is opposite to the first surface of the substrate; and a sealed portion in which the substrate, the semiconductor stacked portion, and the optical filter are sealed so that at least part of the optical filter is exposed. The thickness $T_{sub}$ [μm] of the substrate and the thickness $T_{opt}$ [μm] of the optical filter satisfy the relations of $T_{opt} \geq 4$ and $T_{opt} \leq 0.000053 \times T_{sub}^{2.0488}$.

With the semiconductor device of the first embodiment, a light emitting/receiving component excellent in wavelength selectivity can be obtained, and in addition, the internal stress of the semiconductor device can be sufficiently reduced; changes in the diode characteristics due to changes in the external environment, for example, the temperature and the humidity can be reduced; and a failure due to separation of an optical thin film can be restrained because the thickness $T_{sub}$ [μm] of the substrate and the thickness $T_{opt}$ [μm] of the optical filter satisfy relations of $T_{opt} \geq 4$ and $T_{opt} \leq 0.000053 \times T_{sub}^{2.0488}$.

<Semiconductor Device of Second Embodiment>

A semiconductor device according to a second embodiment of the present disclosure includes: a substrate; a semiconductor stacked portion formed on a first surface of the substrate, the semiconductor stacked portion being capable of emitting or receiving infrared light; and an optical filter formed on a second surface of the substrate that is opposite to the first surface. An interlayer made of Si with a thickness of 50 μm or more and 300 μm or less is provided between the optical filter and the substrate, and the thickness of the optical filter is 10% or less of the thickness of the substrate.

With the semiconductor device of the second embodiment, the internal stress of the semiconductor device can be sufficiently reduced; changes in the diode characteristics due to changes in the external environment, for example, the temperature and the humidity can be reduced; and a failure due to separation of an optical thin film can be restrained because the interlayer made of Si with a thickness of 50 μm or more and 300 μm or less is provided between the optical filter and the substrate and the thickness of the optical filter is 10% or less of the thickness of the substrate.

<Gas Concentration Measuring Device>

A gas concentration measuring device according to a first embodiment of the present disclosure includes: a light emitting unit outputting infrared light absorbed by a gas to be detected; a gas cell into which the gas to be detected is introduced; and a light receiving unit that receives infrared light having been outputted from the light emitting unit and transmitted through the gas cell and outputs a signal depending on the amount of the received infrared light. At least one of the light emitting unit and the light receiving unit is the semiconductor device according to the first or second embodiment.

With the gas concentration measurement device of the first embodiment, both reduction in the module size and high detection performance of a gas sensor using the device are achieved because at least one of the light emitting unit and the light receiving unit is the semiconductor device according to the first or second embodiment.

The semiconductor wafers according to the above first and second embodiments (hereinafter collectively referred to as "semiconductor wafer of this embodiment") and the features of the semiconductor devices according to the first and second embodiments (hereinafter collectively referred to as "semiconductor device of this embodiment") will now be described.

<<Wafer Substrate>>

A wafer substrate of a semiconductor wafer of this embodiment is not limited as long as the wafer substrate has a semiconductor stacked portion on its first surface, the semiconductor stacked portion being capable of emitting or receiving infrared light. In terms of obtaining high productivity of semiconductor devices, the diameter of the wafer substrate is preferably 2 inches or more and 8 inches or less. Examples of the wafer substrate include a silicon substrate and a gallium arsenide substrate.

<<Substrate>>

A substrate of a semiconductor device of this embodiment is not limited as long as the substrate has a semiconductor stacked portion on its first surface, the semiconductor stacked portion being capable of emitting or receiving infrared light. Examples of the substrate include a silicon substrate and a gallium arsenide substrate. In terms of achieving both reduction in the module size and high detection performance of a gas sensor using the substrate, the thickness of the substrate is preferably 240 μm or more and 600 μm or less in the first embodiment.

<<Semiconductor Stacked Portion>>

A semiconductor stacked portion in the semiconductor wafer and the semiconductor device of this embodiment is not limited as long as the semiconductor stacked portion can emit or receive infrared light.

The semiconductor stacked portion preferably has an active layer; in terms of obtaining a sensor having selective spectral characteristics with respect to desired wavelengths in a mid-infrared range, the active layer is preferably $Al_xIn_{1-x}Sb$ (0≤x≤0.20) or $InAs_ySb_{1-y}$ (0.10≤y≤0.20) or $InAs_ySb_{1-y}$ (0.75≤y≤1).

<<Optical Filter>>

In terms of reducing wafer warpage by simplifying the design of an interference filter, the optical filter in the semiconductor wafer of this embodiment and the semiconductor device of this embodiment preferably has a first layer having a refractive index of 1.2 or more and 2.5 or less with respect to infrared light with a wavelength of 2.4 μm or more and 6 μm or less and a second layer having a refractive index of 2 or more and 4.2 or less with respect to infrared light with a wavelength of 2.4 μm or more and 6 μm or less. More preferably, the optical filter is formed by alternately stacking the first layer and the second layer twice or more and 25 times or fewer.

In terms of reducing absorption of light in a mid-infrared range and efficiently transmitting infrared light with desired wavelengths, the optical filter in the semiconductor wafer of this embodiment and the semiconductor device of this embodiment preferably contain at least one of SiO, $SiO_2$, $TiO_2$, and ZnS.

In terms of reducing absorption of light in a mid-infrared range and efficiently transmitting infrared light with desired wavelengths, the optical filter in the semiconductor wafer of this embodiment and the semiconductor device of this embodiment preferably contain at least one of Si and Ge.

Further, in terms of mass productivity, there are cases where the area of the wafer substrate or the substrate and the area of the optical filter in plan view are preferably approximately the same. The term "approximately the same" here means being within a range meeting the intended purpose, yet may mean that the relative difference between the areas is 10% or less.

Preferred embodiments of the present disclosure will now be described with reference to the accompanying drawings. Here, throughout this specification and the drawings, components having substantially the same functions are denoted by the same reference numerals and the description will not be repeated.

(Semiconductor Device)

FIG. 1 is an external perspective view schematically illustrating the structure of a semiconductor device 1 according to one embodiment of the present disclosure. As illustrated in FIG. 1, the semiconductor device 1 includes an optical filter 10, a sealed portion 20, and an electrode 30 that are externally visible.

Figure 2:
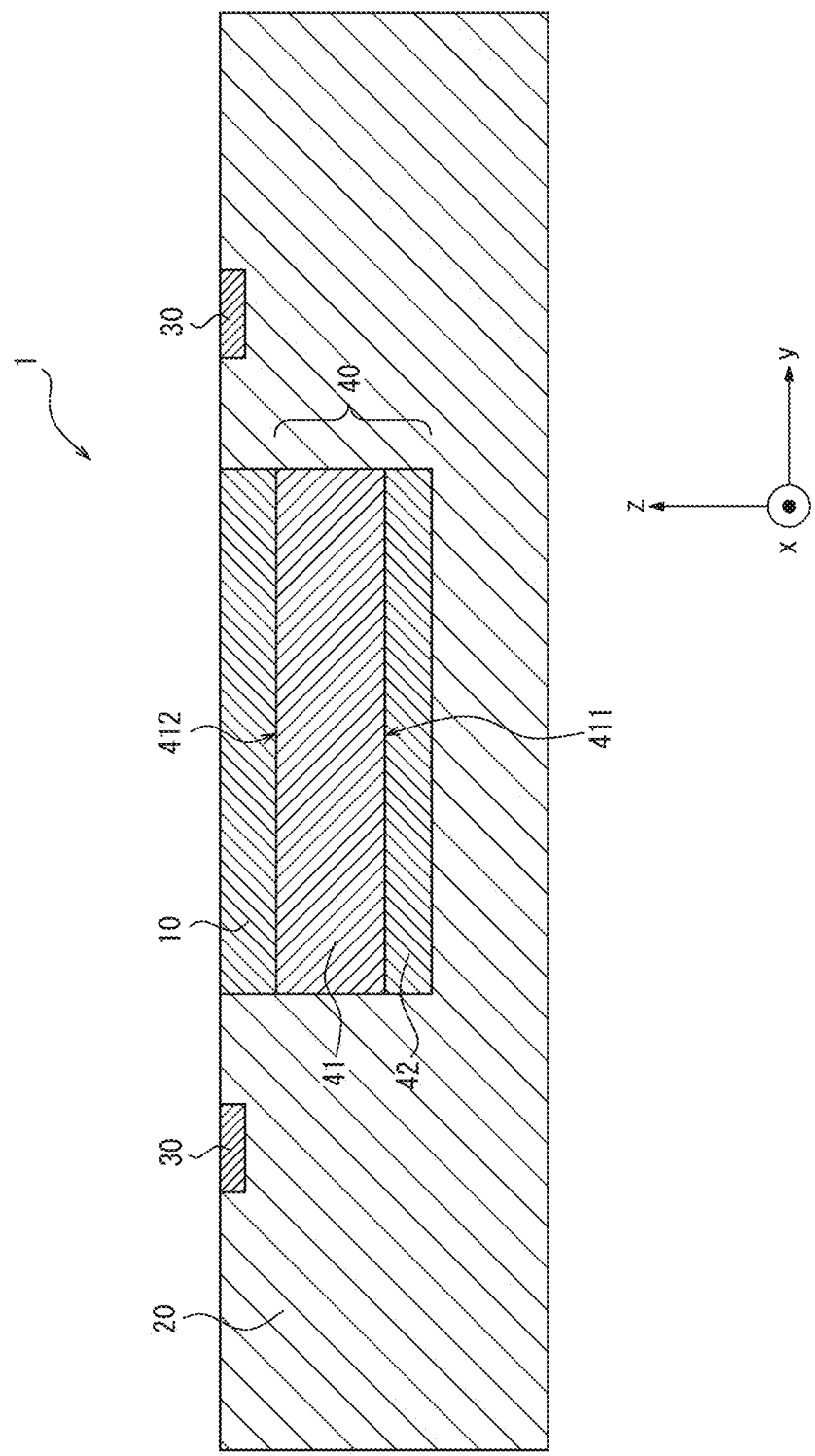
FIG. 2 is a cross-sectional view of the semiconductor device of FIG. 1, taken along line A-A.

FIG. 2 is a cross-sectional view of the semiconductor device 1 of FIG. 1, taken along line A-A. As illustrated in FIG. 2, the semiconductor device 1 includes a light emitting/receiving element 40 covered with the sealed portion 20 and the optical filter 10. As illustrated in FIG. 1 and FIG. 2, the semiconductor device 1 includes the optical filter 10, the sealed portion 20, the electrode 30, and the light emitting/receiving element 40.

(Light Emitting/Receiving Element)

The light emitting/receiving element 40 includes a substrate 41 and a semiconductor stacked portion 42. The light emitting/receiving element 40 is either a light receiving element receiving infrared light or a light emitting element emitting infrared light.

(Substrate)

As illustrated in FIG. 2, the substrate 41 of the light emitting/receiving element 40 has a first surface 411 that is a main surface on the semiconductor stacked portion 42 side and a second surface 412 that is a main surface on the optical filter 10 side opposite to the first surface 411. The substrate 41 is for example, but not limited to, a GaAs substrate (see FIG. 3). The substrate 41 may be a different substrate, for example, a Si substrate.

(Semiconductor Stacked Portion)

FIG. 3 is a cross-sectional view of the light emitting/receiving element 40. The semiconductor stacked portion 42 of the light emitting/receiving element 40 includes an active layer 424 made of a compound semiconductor and emits infrared light in the direction of the substrate 41 or receives infrared light through the substrate 41. The active layer 424 is a light absorption layer when the light emitting/receiving element 40 is a light receiving element, whereas the active layer 424 is a light emitting layer when the light emitting/receiving element 40 is a light emitting element. The semiconductor stacked portion 42 is formed on the first surface 411 of the substrate 41.

Here, the term "on" in "the semiconductor stacked portion 42 is formed on the first surface 411 of the substrate 41" is used to describe the case where the semiconductor stacked portion 42 is formed in contact with the first surface 411 of the substrate 41 and also cases where another layer is present between the first surface 411 of the substrate 41 and the semiconductor stacked portion 42. The term "on" used in describing the relationship between other layers shall be interpreted to have the like meaning. For example, in the layered structure of the semiconductor stacked portion 42 in FIG. 3 to be described, a second n-type compound semiconductor layer 422, an n-type barrier layer 423, the active layer 424, a p-type barrier layer 425, and a p-type compound semiconductor layer 426 are all formed on a first n-type compound semiconductor layer 421.

The semiconductor stacked portion 42 includes the first n-type compound semiconductor layer 421, the second n-type compound semiconductor layer 422, the n-type barrier layer 423, the active layer 424, the p-type barrier layer 425, and the p-type compound semiconductor layer 426. The first n-type compound semiconductor layer 421 serves as a buffer layer for lattice relaxation and serves to transmit infrared light in a desired mid-infrared range. The first n-type compound semiconductor layer 421 contains, for example, InSb doped to have n-type conductivity. The second n-type compound semiconductor layer 422 serves as an n-layer of a PIN diode and serves to transmit infrared light in a desired mid-infrared range. The second n-type compound semiconductor layer 422 contains, for example, AlInSb doped to have n-type conductivity. The n-type barrier layer 423 serves, together with the p-type barrier layer 425, to confine carriers in a light emitting element, and serves to prevent leakage due to thermally excited carriers. The n-type barrier layer 423 contains, for example, $Al_yIn_{1-y}Sb$ ($0.15 \leq y \leq 0.40$) doped to have n-type conductivity. The active layer 424 serves as a photoelectric conversion layer in a light receiving element and as a light emitting layer in a light emitting element. The active layer 424 contains $Al_xIn_{1-x}Sb$ ($0.02 \leq x \leq 0.20$) that is undoped or doped to have p-type conductivity. The p-type barrier layer 425 serves, together with the n-type barrier layer 423, to confine carriers in the light emitting element, and serves to prevent leakage due to thermally excited carriers. The p-type barrier layer 425 contains, for example, $Al_zIn_{1-z}Sb$ ($0.15 \leq z \leq 0.40$) doped to have p-type conductivity. The p-type compound semiconductor layer 426 serves as a p-layer of a PIN diode. The p-type compound semiconductor layer 426 contains, for example, AlInSb doped to have p-type conductivity.

Here, the composition of the above layers is an example. For example, the active layer 424 may contain $Al_xIn_{1-x}Sb$ ($0 \leq x \leq 0.20$), $InAs_ySb_{1-y}$ ($0.10 \leq y \leq 0.20$), or $InAs_ySb_{1-y}$ ($0.75 \leq y \leq 1$) as a compound semiconductor. For example, the second n-type compound semiconductor layer 422 may contain AlInSb or InSb doped to have n-type conductivity. For example, the p-type compound semiconductor layer 426 may contain AlInSb or InSb doped to have p-type conductivity.

Here, the term "contain" in the wording "the first n-type compound semiconductor layer 421 . . . contain(s) InSb" is used to describe the case where InSb is contained as a main component of the first n-type compound semiconductor layer 421, yet may also be used to describe cases where other elements are contained. Specifically, this term may also be used to describe cases where a slight change is made to the composition of this layer by adding a small amount of other elements (for example, by adding an element such as As, Al, Ga, Si, Sn, Zn, or N by not more than several percent). The term "contain" used in describing the composition of other layers has the like meaning.

(Optical Filter)

Figure 4:
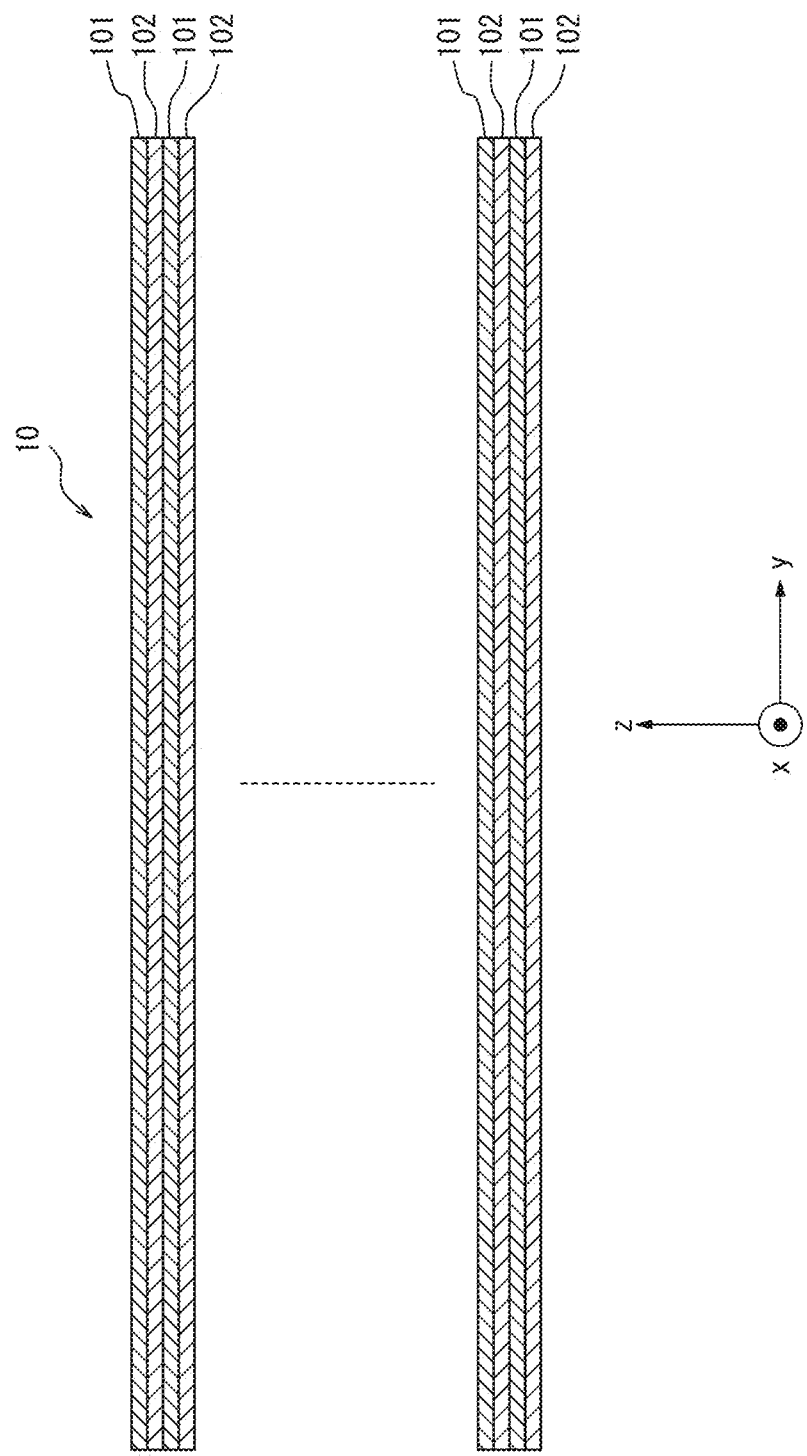
FIG. 4 is a cross-sectional view of an optical filter.

FIG. 4 is a cross-sectional view of the optical filter 10. The optical filter 10 has a first layer 101 having a refractive index of 1.2 or more and 2.5 or less with respect to infrared light in a wavelength range of 2.4 μm or more and 6 μm or less and a second layer 102 having a refractive index of 2 or more and 4.2 or less with respect to infrared light in a wavelength range of 2.4 μm or more and 6 μm or less. The optical filter 10 is formed on the second surface 412 of the substrate 41.

Here, the optical filter 10 is preferably formed by alternately stacking the first layer 101 and the second layer 102 twice or more and 25 times or fewer. The stacking of twice or more and 25 times or fewer makes it possible to obtain a light emitting/receiving component that is easily assembled with low stress. Further, in order to obtain selective and highly accurate gas detection capability, the layers in the multilayer film are necessarily stacked to achieve a sufficiently large thickness, and the relation of $T_{opt} \geq 4$ is preferably satisfied. Moreover, in terms of reducing height and reducing cost, the thickness $T_{opt}$ [μm] of the optical filter satisfies the relation of $T_{opt} \leq 0.000053 \times T_{sub}^{2.0488}$ with respect to the thickness $T_{sub}$ [μm] of the substrate. Alternatively, the thickness of the optical filter is preferably 26 μm or less. Yet alternatively, when an interlayer made of Si with a thickness of 50 μm or more and 300 μm or less is provided between the substrate and the optical filter, the thickness of the optical film is preferably 10% or less of the thickness of the substrate or 60 μm or less.

When the above thickness range is met, the warpage of the substrate due to stress can reduced particularly in cases where an optical thin film of a material such as SiO, $SiO_2$, $TiO_2$, or ZnS is used as the optical filter.

The first layer 101 contains at least one of for example SiO, $SiO_2$, $TiO_2$, and ZnS. The second layer 102 contains at least one of Si and Ge.

Further, the characteristics of the first layer 101 and the second layer 102 in the optical filter 10 may be changed depending on the wavelength range of the infrared light emitted or received by the light emitting/receiving element 40. For example, when the wavelength range of the infrared light emitted or received by the light emitting/receiving element 40 is 2.4 μm or more and 10 μm or less, the optical filter 10 may have a first layer 101 having a refractive index of 1.2 or more and 2.5 or less with respect to infrared light with a wavelength of 2.4 μm or more and 6 μm or less and a second layer 102 having a refractive index of 2 or more and 4.2 or less.

(Sealed Portion)

As illustrated in FIG. 1 and FIG. 2, the semiconductor device 1 includes a sealed portion 20 in which the substrate 41, the semiconductor stacked portion 42, and the optical filter 10 are sealed so that the optical filter 10 is partly exposed. The sealed portion 20 may be made of a resin such as a mold resin or a potting resin. As illustrated in FIG. 2, the side surfaces of the substrate 41, the semiconductor stacked portion 42, and the optical filter 10 (surfaces parallel to the z axis) are covered with the sealed portion 20, so that the resistance to vibrations is excellent.

(Electrode)

The electrode 30 is a conductor for supplying power to or drawing a current from the light emitting/receiving element 40. The electrode 30 may be formed from, for example, Cu or an alloy of Cu.

(Gas Concentration Measuring Device)

Figure 5:
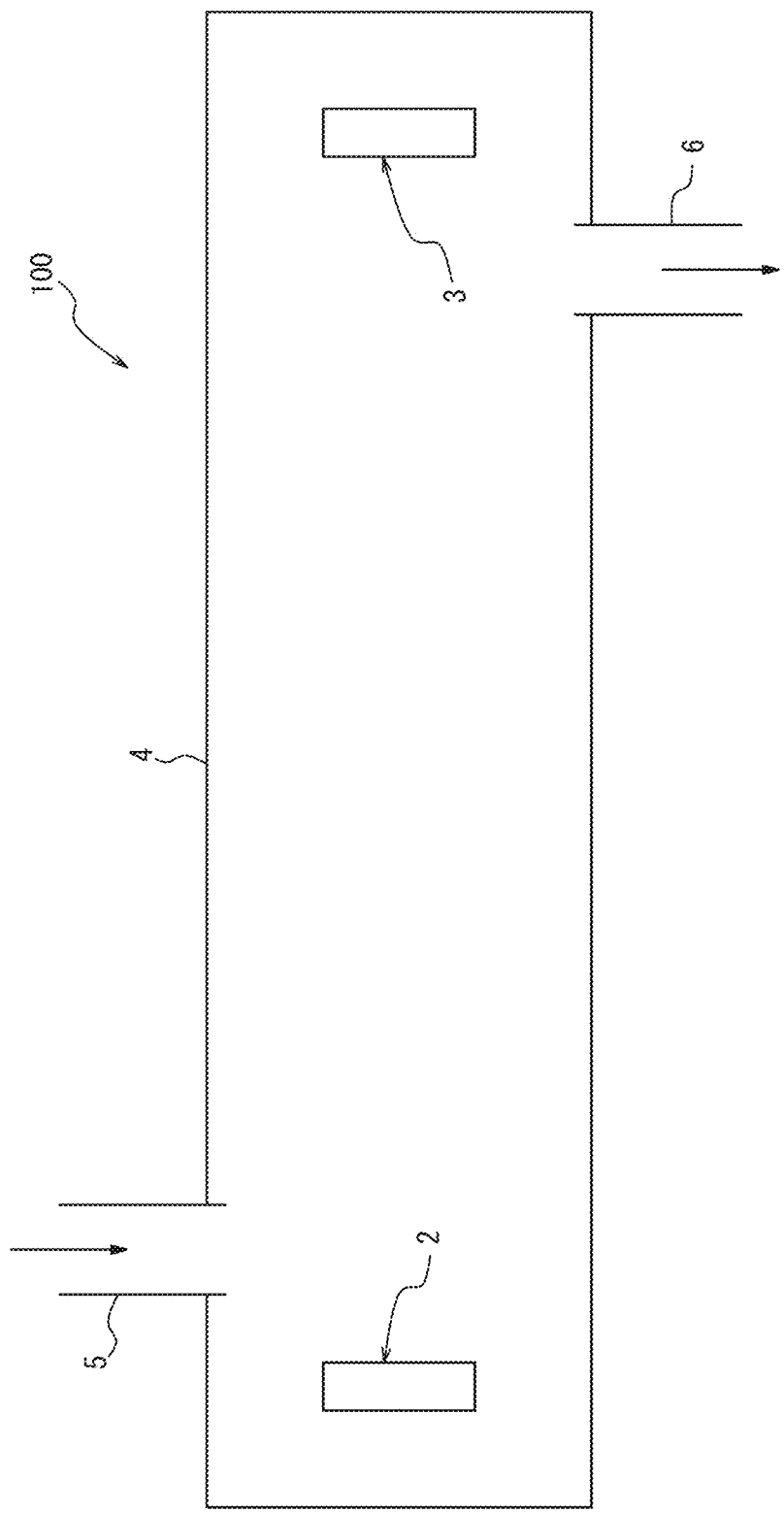
FIG. 5 is a diagram illustrating an example configuration of a gas concentration measuring device including a semiconductor device according to one embodiment of the present disclosure.

FIG. 5 is a diagram illustrating an example configuration of a gas concentration measuring device 100 including the semiconductor device 1. The gas concentration measuring device 100 includes a light emitting unit 2, a light receiving unit 3, a gas cell 4, a gas inlet 5, and a gas outlet 6.

In the gas concentration measuring device 100, infrared light emitted from the light emitting unit 2 is absorbed by a gas to be detected in the gas cell 4. The light receiving unit 3 receives infrared light having been transmitted through the gas cell 4, that is, the infrared light having been absorbed by the gas to be detected. The light receiving unit 3 outputs a signal depending on the amount of the received infrared light. Here, the amount of the received infrared light changes depending on the concentration of the gas to be detected. Accordingly, the gas concentration measuring device 100 can measure the concentration of the gas to be detected based on the output signal from the light receiving unit 3. The concentration of the gas to be detected may be calculated based on the output signal from the light receiving unit 3 by a calculation unit such as a processor that is included in the gas concentration measuring device 100 or provided outside the gas concentration measuring device 100. The gas to be detected is for example $CO_2$, CO, $CH_4$, $H_2O$, $C_2H_5OH$, $CH_2O$, $C_3H_8$, $NH_3$, NO, etc., and is introduced into the gas cell 4 through the gas inlet 5 and exhausted through the gas outlet 6.

The semiconductor device 1 may be used as at least one of the light emitting unit 2 and the light receiving unit 3 of the gas concentration measuring device 100. For example, the semiconductor device 1, in which the light emitting/receiving element 40 is a light emitting element, may be used as the light emitting unit 2 of the gas concentration measuring device 100. In this case, the semiconductor device 1 is provided in the gas concentration measuring device 100 so that the exposed part of the optical filter 10 faces the light receiving unit 3. Alternatively, the semiconductor device 1, in which the light emitting/receiving element 40 is a light receiving element, may be used as the light receiving unit 3 of the gas concentration measuring device 100. In this case, the semiconductor device 1 is provided in the gas concentration measuring device 100 so that the exposed part of the optical filter 10 faces the light emitting unit 2. Further, a semiconductor device 1, in which the light emitting/receiving element 40 is a light emitting element, and another semiconductor device 1, in which the light emitting/receiving element 40 is a light receiving element, may be used as the light emitting unit 2 and the light receiving unit 3 of the gas concentration measuring device 100, respectively.

Figure 7:
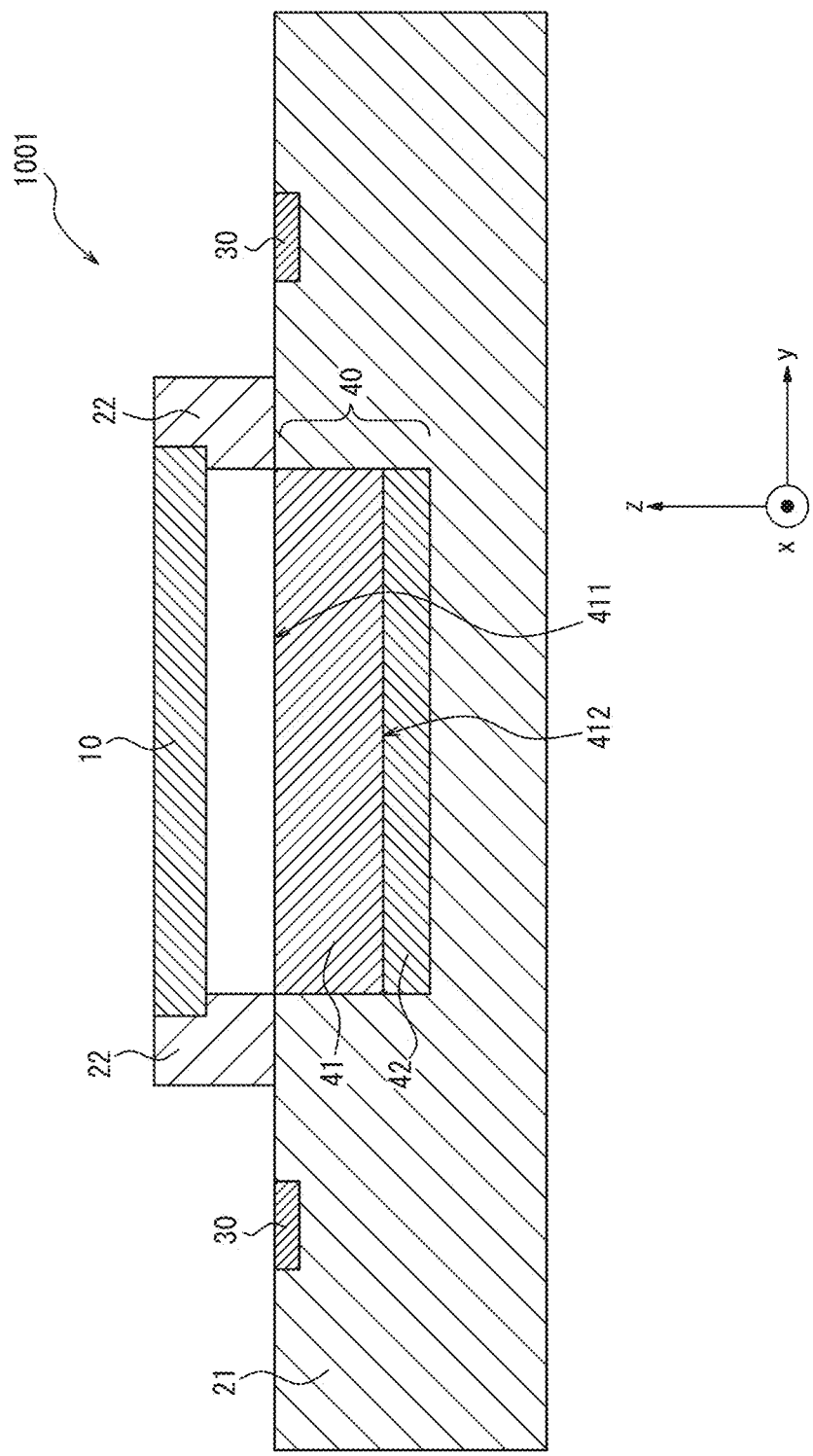
FIG. 7 is a cross-sectional view of a semiconductor device of a conventional example.

As described above, the semiconductor device 1 includes the substrate 41; the semiconductor stacked portion 42 that is formed on the first surface 411 of the substrate 41, includes an active layer of a compound semiconductor, and emits infrared light in the direction of the substrate 41 or receives infrared light through the substrate 41; and the optical filter 10 formed on the second surface 412 of the substrate 41, the optical filter including the first layer 101 and the second layer 102. Here, FIG. 7 is a cross-sectional view of a semiconductor device 1001 of a conventional example. The semiconductor device 1001 has a structure in which the sealed portion 22 supporting the optical filter 10 is connected to a sealed portion 21 in which the light emitting/receiving element 40 is connected. Meanwhile, the semiconductor device 1001 has a structure in which the optical filter 10 that is an independent component is mounted on a part of the sealed portion 22 with, for example, an adhesive. In the semiconductor device 1001, an air layer is inevitably formed between the substrate 41 and the optical filter 10; in order to avoid interference of light in the air layer, the optical filter 10 is necessarily separated from the substrate 41 at least by a certain distance. By contrast, since the optical filter 10 is provided in contact with the first surface 411 of the substrate 41 in the semiconductor device 1 having the above structure, the device can be even smaller than devices obtained by conventional techniques.

Another Embodiment

Figure 6:
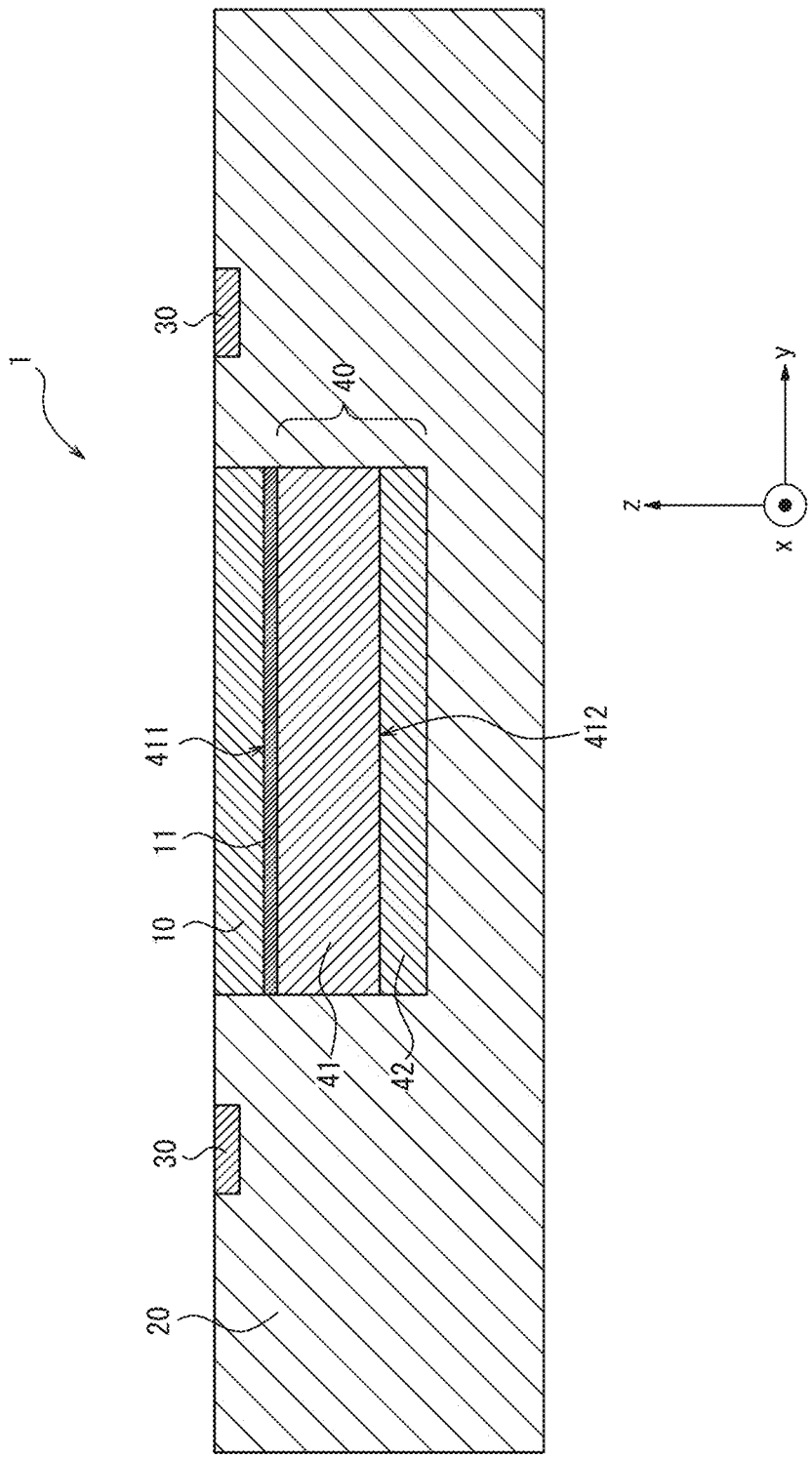
FIG. 6 is a cross-sectional view of a semiconductor device according to another embodiment of the present disclosure.

FIG. 6 is a cross-sectional view of the semiconductor device 1 according to another embodiment of the present disclosure. FIG. 6 corresponds to FIG. 2 of the above embodiment. Here, the external perspective view of the semiconductor device 1 according to this embodiment, the structure of the optical filter 10, and the structure of the light emitting/receiving element 40 are the same as those in the above embodiment, so the description will not be repeated.

The semiconductor device 1 of this embodiment includes the optical filter 10, an interlayer 11, the sealed portion 20, the electrodes 30, and the light emitting/receiving element 40. Unlike in the above embodiment, the semiconductor device 1 of this embodiment includes the interlayer 11 between the substrate 41 and the optical filter 10. The interlayer 11 is made of, for example, Si. The interlayer 11 made of Si can improve the robustness of the semiconductor device 1 according to this embodiment so that the stability in the assembly process can be increased in addition to achieving the effect obtained by the semiconductor device 1 of the above embodiment. Here, when the thickness of the interlayer 11 is made excessively small, the effect of robustness of the semiconductor device 1 can be hardly achieved, and the influence due to warpage of the interlayer 11 on the semiconductor device 1 would be increased. Further, when the thickness of the interlayer 11 is made excessively large, the miniaturization (height reduction) would be limited. From the above viewpoint, the thickness of the interlayer 11 is preferably, for example, 50 μm or more and 300 μm or less. The thickness of the interlayer 11 is more preferably, for example, 100 μm or more and 250 μm or less. The thickness of the interlayer 11 is still more preferably, for example, 150 μm or more and 200 μm or less.

EXAMPLES

The present disclosure is described in detail below based on examples. However, the present disclosure is not limited to the following examples, and various modifications are possible without departing from the spirit of the disclosure.

Example 1

A semiconductor wafer and a semiconductor device of this embodiment will be described based on an example of the production of an IR sensor including an optical filter on the back surface of an infrared light emitting element. First, a PIN diode structure was prepared on a GaAs substrate having a diameter of 4 inches by MBE. An active layer was $Al_{0.04}In_{0.96}Sb$. An n-type semiconductor layer was doped with Sn at $1.0 \times 10^{19}$ atoms/cm$^3$, so that the energy band was degenerated and it was transparent to infrared light having a wavelength longer than 2000 nm. Further, n-type $Al_{0.22}In_{0.78}Sb$ and p-type $Al_{0.22}In_{0.78}Sb$ were prepared as barrier layers so that the active layer was sandwiched between the barrier layers. FIG. 3 illustrates the structure of the stacked layers in the infrared light emitting element according to Example 1. A positive photoresist for i-line was applied to the surface of the semiconductor wafer thus prepared, and exposure was performed using the i-line with a stepper. Subsequently, development was performed, thus a plurality of resist patterns were regularly formed on the surface of the semiconductor stacked portion. Next, a plurality of mesas were formed by dry etching. After depositing $SiO_2$ as a hard mask on the elements each having a mesa shape, element isolation was performed by dry etching, and SiN was then deposited as a protective film, followed by the formation of contact holes by photolithography and dry etching. After that, the plurality of mesas were connected in series by photolithography and sputtering. Subsequently, a polyimide resin was formed as a protective film to cover the element surface.

The thus processed compound semiconductor wafer was thinned to 350 μm by polishing its back surface, and the optical filter of FIG. 10 was formed on the back surface of the compound semiconductor wafer using a vapor deposition system, thus a semiconductor wafer of this embodiment was prepared.

The optical filter was designed based on simulation. The simulation method used was a known calculation method using the Fresnel coefficients. In addition, literature data were used as the wavelength dispersion data of the complex refractive indices of the materials of the optical thin film (Ge and SiO) in the simulation.

The thickness $T_{waf}$ (350 μm) of the wafer substrate and the thickness $T_{opt}$ (7.8 μm) of the optical filter in the semiconductor wafer obtained in Example 1 satisfy the relations of $T_{opt} \geq 4$ and $T_{opt} \leq 0.000053 \times T_{waf}^{2.0488}$.

The amount of warpage of the above-described semiconductor wafer was estimated to be 275 μm using a known formula based on the bimetal theory. Here, the amount of warpage of the semiconductor wafer was the amount of warpage defined by the difference between the heights of the wafer center and the outermost wafer periphery. The amount of wafer warpage is desirably 300 μm or less in terms of preventing chipping during dicing, and this is met in this example.

Figure 8:
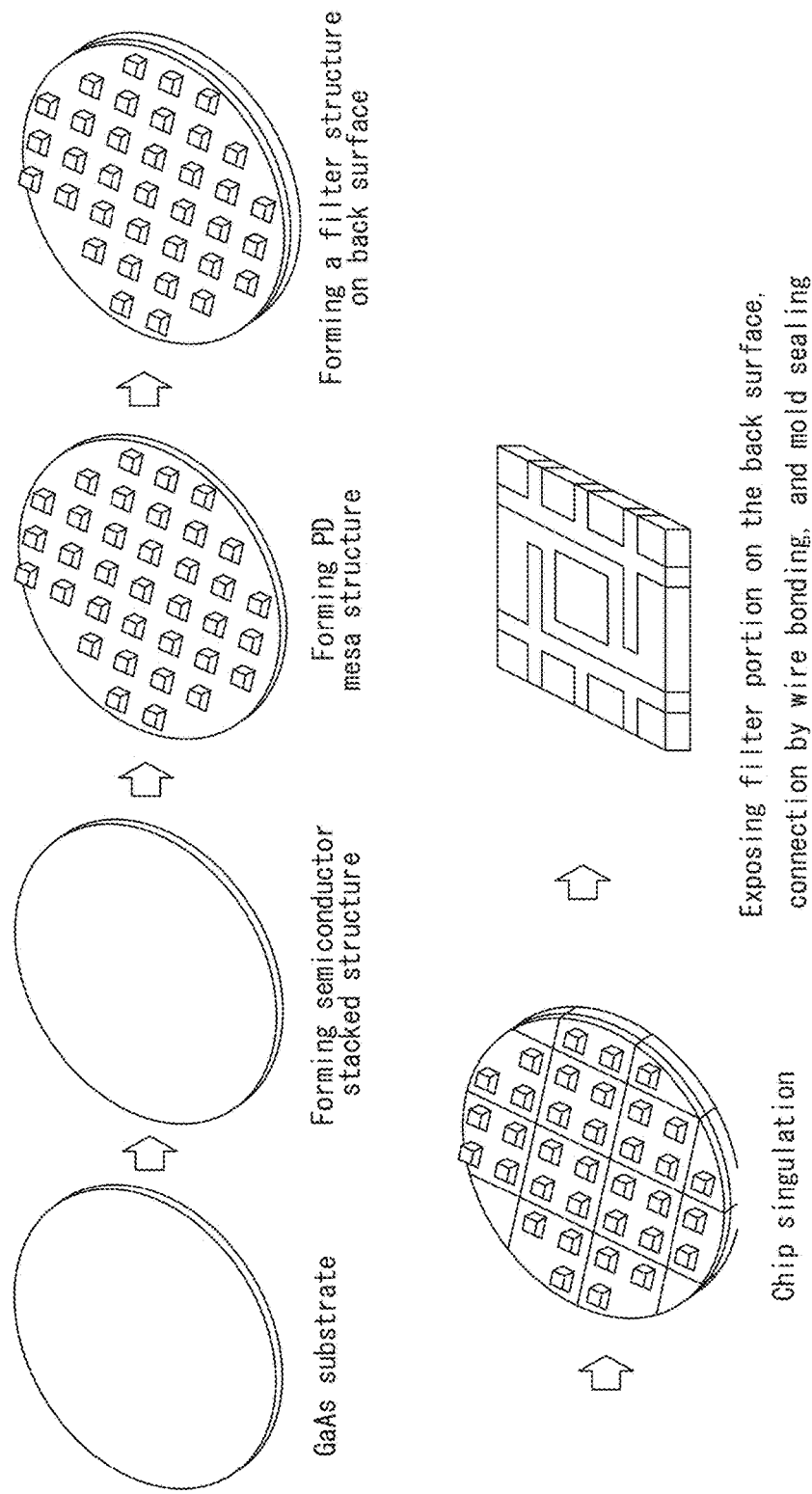
FIG. 8 is a diagram illustrating an example method of producing a semiconductor device according to one embodiment of the present disclosure.

The filter-integrated sensor wafer prepared by the above-described pre-process was diced into pieces, connected to a lead frame using Au bonding wires, and sealed with an epoxy mold resin so that a light emitting surface was exposed. Thus, a semiconductor device of this embodiment was obtained. A semiconductor device that does not include an interlayer as in Example 1 is prepared by for example a production method in FIG. 8.

Figure 11:
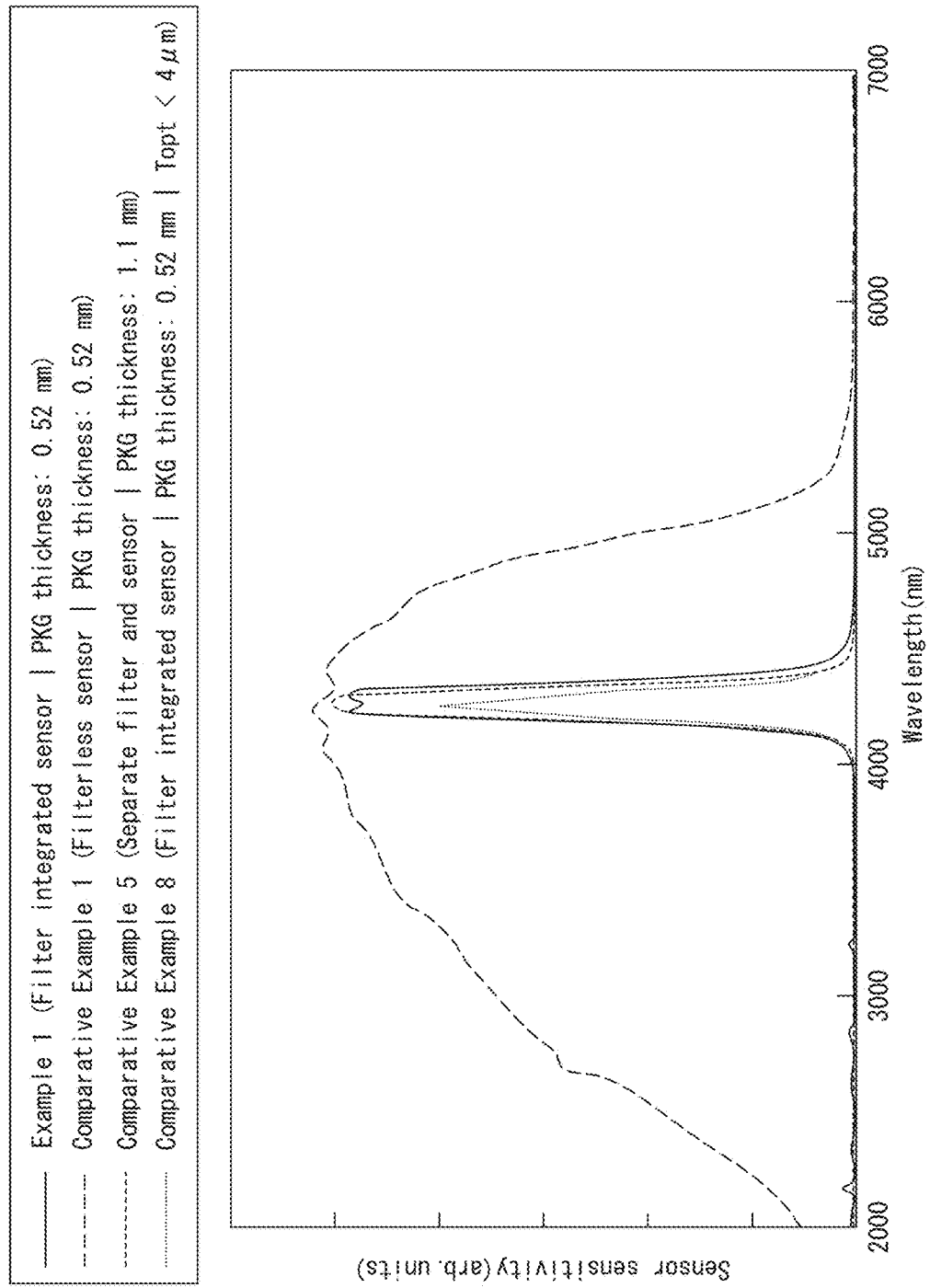
FIG. 11 is a diagram illustrating the spectral sensitivity in Example 1.

The infrared light receiving element thus prepared was subjected to spectral sensitivity spectrum calculation, and the result is illustrated in FIG. 11. FIG. 11 illustrates the spectral sensitivity spectrum of the infrared light emitting element of Example 1. As this result indicates, the package (PKG) size can be reduced to 3.0 mm×3.0 mm×0.52 mm (length×width×thickness, the same applies hereinafter) by integrating an IR sensor conventionally structurally independent with an optical filter, with the comparable spectral sensitivity spectrum being maintained. The IR sensor of a conventional example, illustrated in FIG. 7 had a PKG size of 3.0 mm×3.0 mm×1.1 mm. Thus, the thickness was reduced to approximately half the conventional thickness.

Further, with this structure, a step of packaging an optical filter which is necessarily performed on a conventional IR sensor with an optical filter, illustrated in FIG. 7 was rendered unnecessary; thus, this example is advantageous also in terms of the ease of the process.

Example 2

An IR LED including a Si substrate and an optical filter with an interlayer therebetween on the back surface of an infrared light emitting element will be described. A PIN diode structure was prepared on a GaAs substrate having a diameter of 4 inches by MBE. An active layer was $Al_{0.04}In_{0.96}Sb$. An n-type semiconductor layer was doped with Sn at $1.0 \times 10^{19}$ atoms/cm$^3$, so that the energy band was degenerated and it was transparent to infrared light having a wavelength longer than 2000 nm. Further, n-type $Al_{0.22}In_{0.78}Sb$ and p-type $Al_{0.22}In_{0.78}Sb$ were prepared as barrier layers so that the active layer was sandwiched between the barrier layers. FIG. 3 illustrates the structure of the stacked layers in the infrared light emitting element according to Example 2.

A positive photoresist for i-line was applied to the surface of the semiconductor wafer thus prepared, and exposure was performed using the i-line with a stepper. Subsequently, development was performed, thus a plurality of resist patterns were regularly formed on the surface of the semiconductor stacked portion. Next, a plurality of mesas were formed by dry etching. After depositing $SiO_2$ as a hard mask on the elements each having a mesa shape, element isolation was performed by dry etching, and SiN was then deposited as a protective film, followed by the formation of contact holes by photolithography and dry etching. After that, the plurality of mesas were connected in series by photolithography and sputtering. Subsequently, a polyimide resin was formed as a protective film to cover the element surface.

The thus processed compound semiconductor wafer was thinned to 200 μm by polishing its back surface, and the optical filter of FIG. 12 was formed thereon with a Si substrate as an interlayer of 150 μm therebetween, thus a semiconductor wafer of this embodiment was obtained. In a possible production method, the optical filter is formed on the Si substrate, the back surface of the Si substrate is polished to 150 μm, and the back surface of the compound semiconductor wafer and the back surface of the filter wafer may then be activated by plasma to form covalent bonds. The optical filter was designed based on simulation. The simulation method used was the same as one in Example 1.

In the semiconductor wafer obtained in Example 2, the thickness $T_{opt}$ (6.8 μm) of the optical filter was 3.4% of the thickness $T_{waf}$ (200 μm) of the wafer substrate, which satisfy the ratio of 10% or less as specified in the present disclosure.

A wafer obtained by the above production method can have high stiffness and is less susceptible to the bimetal effect, so that change in the wafer warpage due to the filter integration is small, thus dicing can be performed in such a manner that chipping in the assembly process is controlled.

Figure 9:
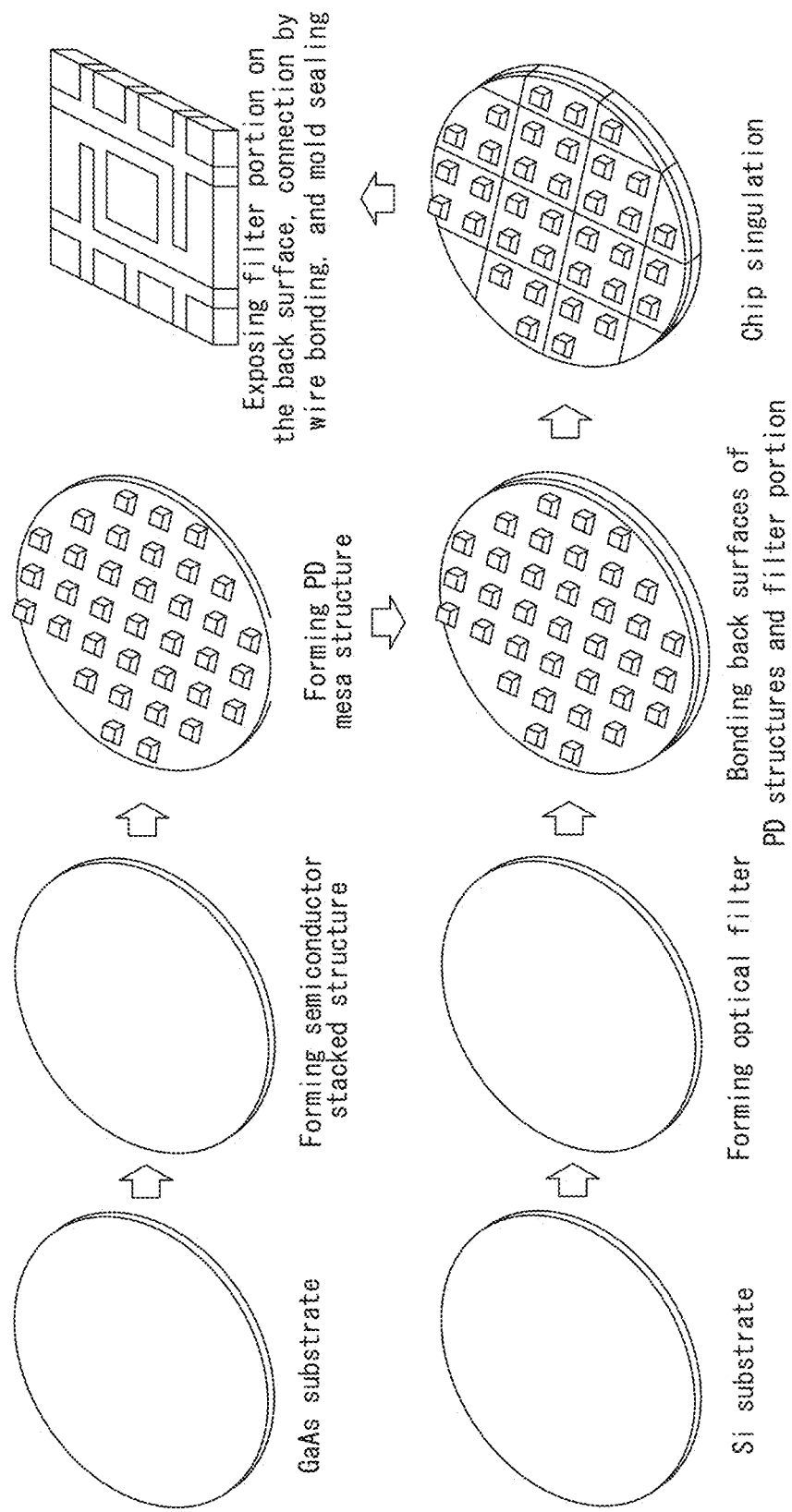
FIG. 9 is a diagram illustrating an example method of producing a semiconductor device according to another embodiment of the present disclosure.

The filter-integrated wafer prepared by the above-described production method was diced into pieces, connected to a lead frame using Au bonding wires, and sealed with an epoxy mold resin so that a light emitting surface was exposed. Thus, a semiconductor device of this embodiment was obtained. A semiconductor device that includes an interlayer as in Example 2 is prepared by for example a production method in FIG. 9.

Figure 13:
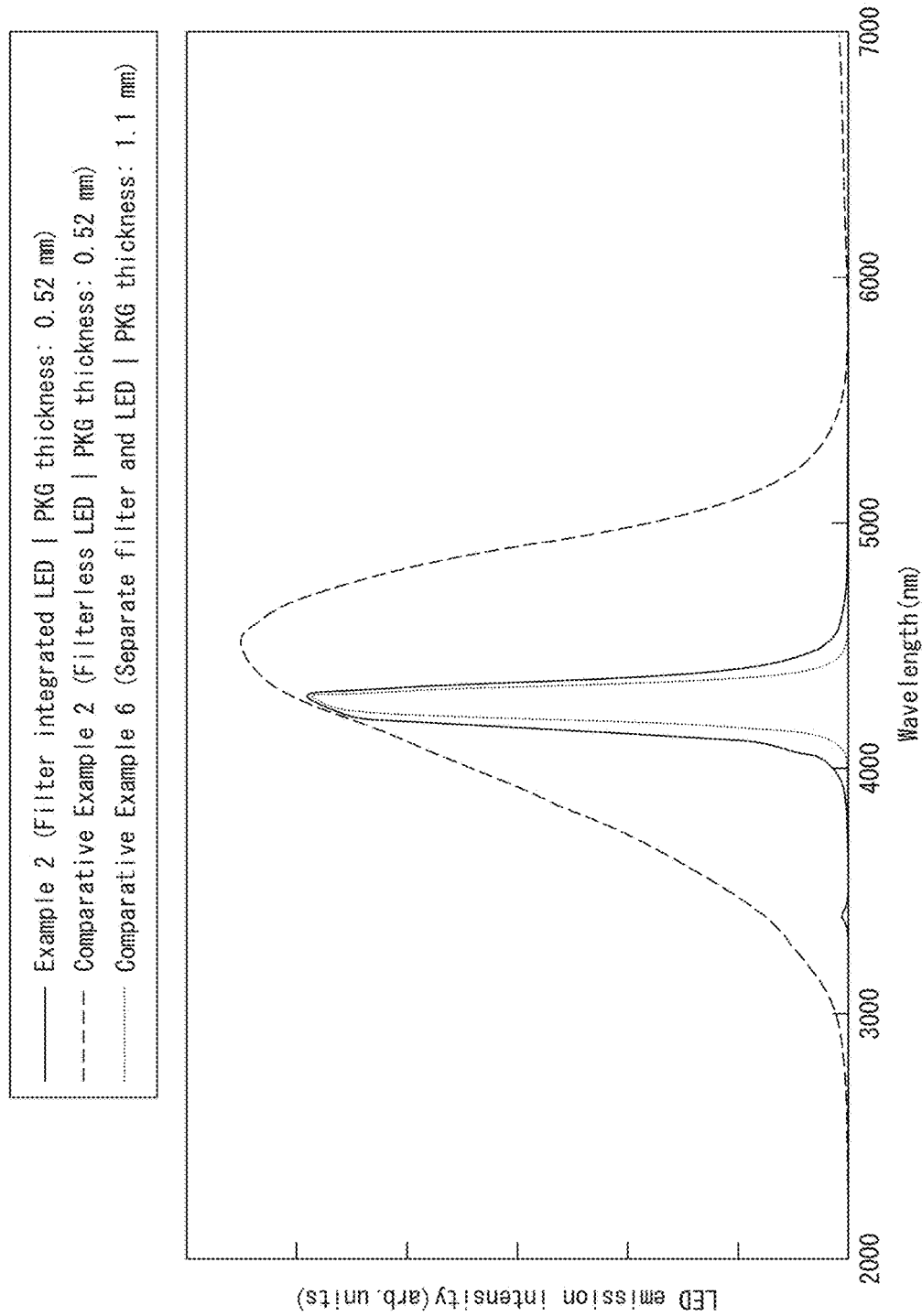
FIG. 13 is a diagram illustrating the emission intensity in Example 2.

The infrared light emitting element thus prepared was subjected to emission intensity spectrum calculation, and the result is illustrated in FIG. 13. FIG. 13 illustrates the emission intensity spectrum of the infrared light emitting element of Example 2. As this result indicates, the PKG size can be reduced from 3.0 mm×3.0 mm×1.1 mm to 3.0 mm×3.0 mm×0.52 mm (length×width×thickness, the same applies hereinafter) by integrating an IR LED conventionally structurally independent with an optical filter, with the comparable emission intensity spectrum being maintained. Further, this structure allows the step of packaging the optical filter to be dispensed with. Moreover, since an IR LED having emission intensity only for the absorption band of $CO_2$ was successfully designed, the flexibility for the design of the optical path in a gas sensor module can be increased. In conventional structures in which an optical filter is placed in front of an IR sensor, the relative positions of the sensor and an LED, and the design for the optical path are limited because the function of the optical filter greatly depends on the incidence angle.

Example 3

An IR sensor including an optical filter on the back surface of an infrared light emitting element will be described. First, a PIN diode structure was prepared on a GaAs substrate having a diameter of 4 inches by MBE. An active layer was $Al_{0.09}In_{0.91}Sb$. An n-type semiconductor layer was doped with Sn at $1.0\times10^{19}$ atoms/cm$^3$, so that the energy band was degenerated and it was transparent to infrared light having a wavelength longer than 2000 nm. Further, n-type $Al_{0.30}In_{0.70}Sb$ and p-type $Al_{0.30}In_{0.70}Sb$ were prepared as barrier layers so that the active layer was sandwiched between the barrier layers. FIG. 3 illustrates the structure of the stacked layers in the infrared light emitting element according to Example 3.

A positive photoresist for i-line was applied to the surface of the semiconductor wafer thus prepared, and exposure was performed using the i-line with a stepper. Subsequently, development was performed, thus a plurality of resist patterns were regularly formed on the surface of the semiconductor stacked portion. Next, a plurality of mesas were formed by dry etching. After depositing $SiO_2$ as a hard mask on the elements each having a mesa shape, element isolation was performed by dry etching, and SiN was then deposited as a protective film, followed by the formation of contact holes by photolithography and dry etching. After that, the plurality of mesas were connected in series by photolithography and sputtering. Subsequently, a polyimide resin was formed as a protective film to cover the element surface.

The thus processed compound semiconductor wafer was thinned to 300 μm by polishing its back surface, and the optical filter of FIG. 14 was formed on the back surface of the compound semiconductor wafer using a vapor deposition system, thus the semiconductor wafer of this embodiment was prepared. The optical filter was designed based on simulation. The simulation method used was the same as one in Example 1.

The thickness $T_{waf}$ (300 μm) of the wafer substrate and the thickness $T_{opt}$ (5.7 μm) of the optical filter in the semiconductor wafer obtained in Example 3 satisfy the relations of $T_{opt}\geq 4$ and $T_{opt}\leq 0.000053\times T_{waf}^{0.0488}$.

The amount of warpage of the above-described semiconductor wafer was estimated to be 275 μm using a known formula based on the bimetal theory. Here, the amount of warpage of the semiconductor wafer was the amount of warpage defined by the difference between the heights of the wafer center and the outermost wafer periphery. The amount of wafer warpage is desirably 300 μm or less in terms of preventing chipping during dicing, and this is met in this example.

The filter-integrated sensor wafer prepared by the above-described pre-process was diced into pieces, connected to a lead frame using Au bonding wires, and sealed with an epoxy mold resin so that a light emitting surface was exposed. Thus, a semiconductor device of this embodiment was obtained.

Figure 15:
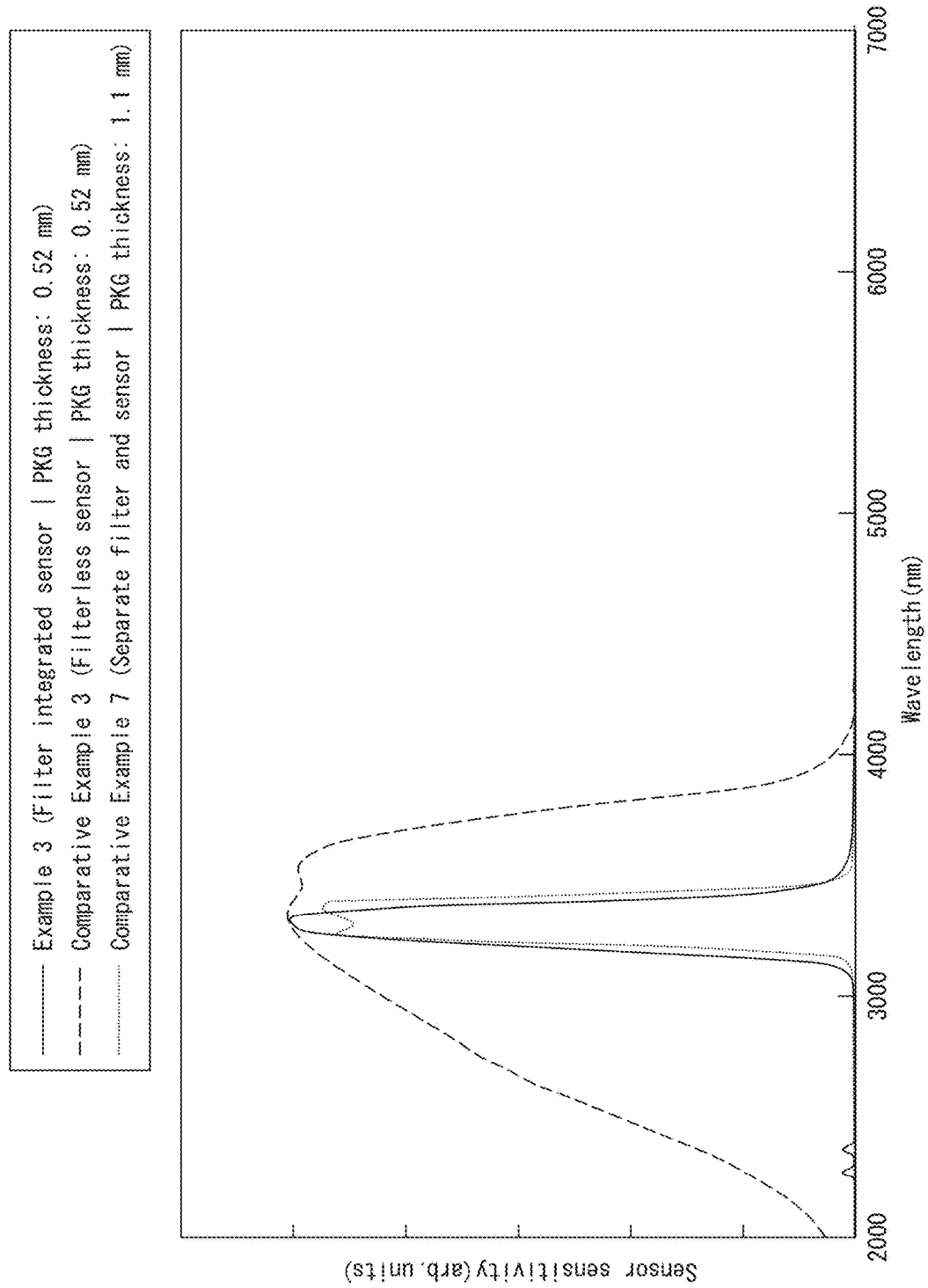
FIG. 15 is a diagram illustrating the spectral sensitivity in Example 3.

The infrared light receiving element thus prepared was subjected to spectral sensitivity spectrum calculation, and the result is illustrated in FIG. 15. FIG. 15 illustrates the spectral sensitivity spectrum of the infrared light emitting element of Example 3. As this result indicates, the PKG size can be reduced from 3.0 mm×3.0 mm×1.1 mm to 3.0 mm×3.0 mm×0.52 mm by integrating an IR sensor conventionally structurally independent with an optical filter, with the comparable spectral sensitivity spectrum being maintained. Further, this structure allows the step of packaging the optical filter to be dispensed with.

Example 4

An IR sensor including a Si substrate and an optical filter with an interlayer therebetween on the back surface of an infrared light emitting element will be described. First, a PIN diode structure was prepared on a GaAs substrate having a diameter of 4 inches by MBE. An active layer was $In_{0.14}As_{0.86}Sb$. An n-type semiconductor layer was doped with Sn at $1.0 \times 10^{19}$ atoms/cm$^3$, so that the energy band was degenerated and it was transparent to infrared light having a wavelength longer than 2000 nm. Further, p-type $Al_{0.22}In_{0.78}Sb$ was prepared as a barrier layer between the active layer and the p-type semiconductor layer. FIG. 3 illustrates the structure of the stacked layers in the infrared light emitting element according to Example 4.

A positive photoresist for i-line was applied to the surface of the semiconductor wafer thus prepared, and exposure was performed using the i-line with a stepper. Subsequently, development was performed, thus a plurality of resist patterns were regularly formed on the surface of the semiconductor stacked portion. Next, a plurality of mesas were formed by dry etching. After depositing $SiO_2$ as a hard mask on the elements each having a mesa shape, element isolation was performed by dry etching, and SiN was then deposited as a protective film, followed by the formation of contact holes by photolithography and dry etching. After that, the plurality of mesas were connected in series by photolithography and sputtering. Subsequently, a polyimide resin was formed as a protective film to cover the element surface.

The thus processed compound semiconductor wafer was thinned to 200 μm by polishing its back surface, and the optical filter of FIG. 16 was formed thereon with a Si substrate as an interlayer of 150 μm therebetween, thus a semiconductor wafer of this embodiment was obtained. In a possible production method, the optical filter is formed on the Si substrate, the back surface of the Si substrate is polished to 150 μm, and the back surface of the compound semiconductor wafer and the back surface of the filter wafer may then be activated by plasma to form covalent bonds. The optical filter was designed based on simulation. The simulation method used was the same as one in Example 1 except for using literature data as the wavelength dispersion data of the complex refractive indices of the materials of the optical thin film that were Ge and ZnS.

In the semiconductor wafer obtained in Example 4, the thickness $T_{opt}$ (16.0 μm) of the optical filter was 8.0% of the thickness $T_{waf}$ (200 μm) of the wafer substrate, which satisfy the ratio of 10% or less as specified in the present disclosure.

A wafer obtained by the above production method can have high stiffness and is less susceptible to the bimetal effect, so that change in the wafer warpage due to the filter integration is small, thus dicing can be performed in such a manner that chipping in the assembly process is controlled.

The filter-integrated sensor wafer prepared by the above-described production method was diced into pieces, connected to a lead frame using Au bonding wires, and sealed with an epoxy mold resin so that a light emitting surface was exposed. Thus, a semiconductor device of this embodiment was obtained.

Figure 17:
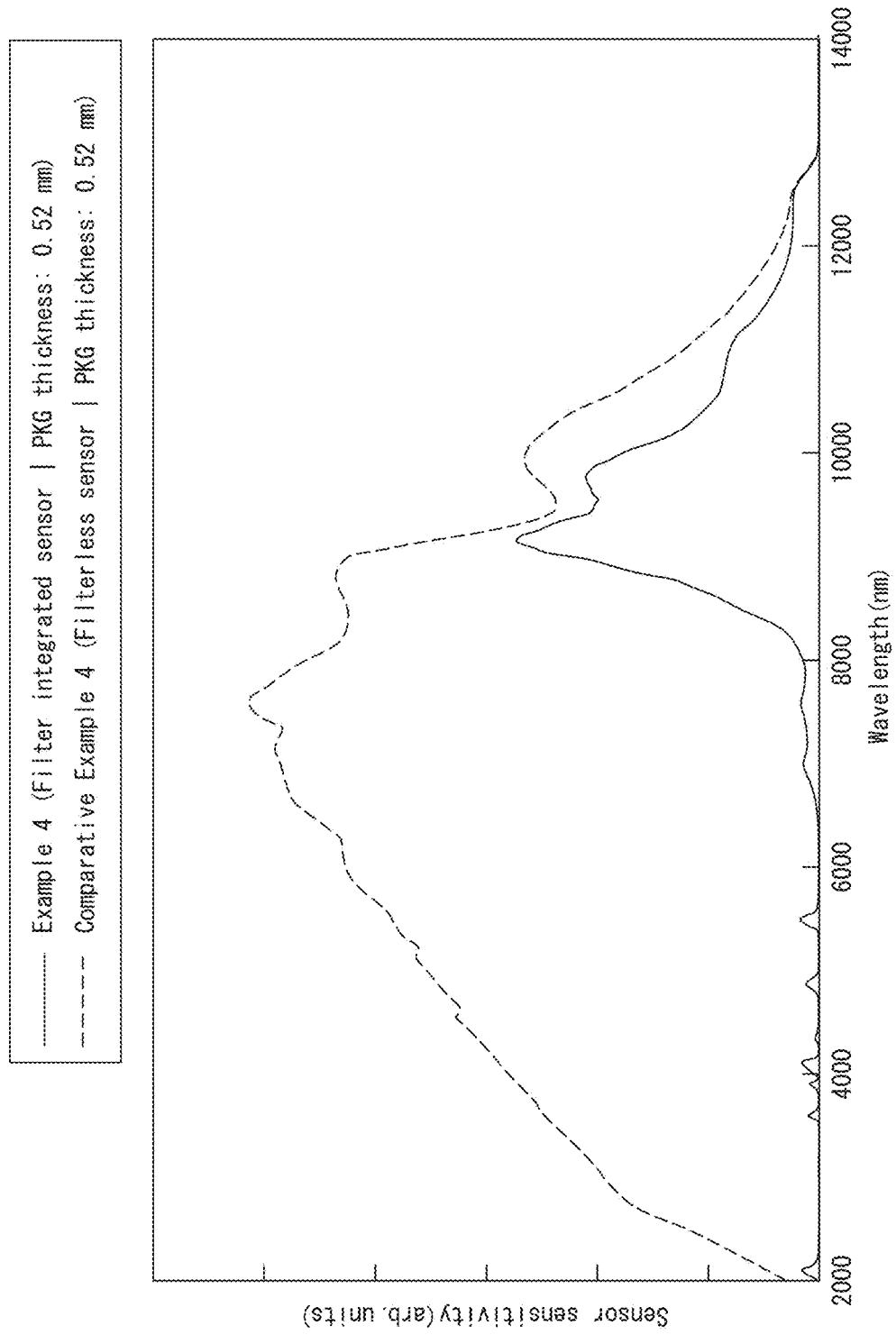
FIG. 17 is a diagram illustrating the spectral sensitivity in Example 3; 4.

The infrared light receiving element thus prepared was subjected to spectral sensitivity spectrum calculation, and the result is illustrated in FIG. 17. FIG. 17 illustrates the spectral sensitivity spectrum of the infrared light emitting element of Example 4. As this result indicates, a sensor that is selectively sensitive to the absorption band of alcohols can be obtained by integrating a filter and an IR sensor.

Comparative Example 1

A semiconductor wafer and an infrared light receiving element were obtained in the same manner as in Example 1 except that the optical filter was not formed.

The result of spectral sensitivity spectrum calculation on the thus obtained infrared light receiving element is illustrated in FIG. 11. In comparison with the infrared light receiving element obtained in Example 1, the infrared light receiving element of Comparative Example 1 had sensitivity to a wide band of 2 μm to 5.5 μm and so was not suitable for selectively detecting the absorption of $CO_2$.

Comparative Example 2

A semiconductor wafer and an infrared light emitting element were obtained in the same manner as in Example 2 except that the optical filter and the interlayer were not formed.

The result of emission intensity spectrum calculation on the thus obtained infrared light emitting element is illustrated in FIG. 13. In comparison with the infrared light emitting element obtained in Example 2, the infrared light emitting element of Comparative Example 2 had emission intensity for a wide band of 3 μm to 5.5 μm and so was not suitable for selectively detecting the absorption of $CO_2$.

Comparative Example 3

A semiconductor wafer and an infrared light receiving element were obtained in the same manner as in Example 3 except that the optical filter was not formed.

The result of spectral sensitivity spectrum calculation on the thus obtained infrared light receiving element is illustrated in FIG. 15. In comparison with the infrared light receiving element obtained in Example 3, the infrared light receiving element of Comparative Example 3 had sensitivity to a wide band of 2 μm to 4 μm and so was not suitable for selectively detecting the absorption of $CH_4$.

Comparative Example 4

A semiconductor wafer and an infrared light receiving element were obtained in the same manner as in Example 4 except that the optical filter was not formed.

The result of spectral sensitivity spectrum calculation on the thus obtained infrared light receiving element is illustrated in FIG. 17. In comparison with the infrared light receiving element obtained in Example 4, the infrared light receiving element of Comparative Example 1 had sensitivity to a wide band of 2 μm to 13 μm and so was not suitable for selectively detecting the absorption of alcohols.

Comparative Example 5

An infrared light receiving element was obtained by mounting a separately prepared filter package on a sensor package the same as one in Comparative Example 1. An optical filter included in the filter package was a band-pass filter designed without considering the wavelength selectivity of the infrared light receiving element, and blocks at least infrared light in a wavelength band of 1 μm to 9 μm excluding the absorption wavelength band of $CO_2$. The thickness of the optical filter portion was 20 µm or more. The optical filter wafer was diced into pieces and was sealed with an epoxy mold resin so that both surfaces of the filter chips were exposed, thus a semiconductor device of this embodiment was prepared.

The result of spectral sensitivity spectrum calculation on the thus obtained infrared light receiving element is illustrated in FIG. 11. The result obtained was comparable to that of the infrared light receiving element obtained in Example 1. On the other hand, the device of Comparative Example 5 had a structure in which the sensor package and the filter package were assembled, and so was hardly reduced in size. The size of the IR sensor in Comparative Example 5 was 3.0 mm×3.0 mm×1.1 mm, thus the device height was approximately twice that in Example 1.

Comparative Example 6

An infrared light emitting element was obtained by mounting a separately prepared filter package on an LED package the same as one in Comparative Example 2. An optical filter included in the filter package was a band-pass filter designed without considering the wavelength selectivity of the infrared light emitting element, and blocks at least infrared light in a wavelength band of 1 µm to 9 µm excluding the absorption wavelength band of $CO_2$. The thickness of the optical filter portion was 20 µm or more. The optical filter wafer was diced into pieces and was sealed with an epoxy mold resin so that both surfaces of the filter chips were exposed, thus a semiconductor device of this embodiment was prepared.

The result of emission intensity spectrum calculation on the thus obtained infrared light emitting element is illustrated in FIG. 13. The result obtained was comparable to that of the infrared light receiving element obtained in Example 2.

On the other hand, the device of Comparative Example 6 had a structure in which the LED package and the filter package were assembled, and so was hardly reduced in size. The size of the IR LED in Comparative Example 6 was 3.0 mm×3.0 mm×1.1 mm, thus the device height was approximately twice that in Example 2.

Comparative Example 7

An infrared light receiving element was obtained by mounting a separately prepared filter package on a sensor package the same as one in Comparative Example 3. An optical filter included in the filter package was a band-pass filter designed without considering the wavelength selectivity of the infrared light receiving element, and blocks at least infrared light in a wavelength band of 1 µm to 9 µm excluding the absorption wavelength band of $CH_4$. The thickness of the optical filter portion was 20 µm or more. The optical filter wafer was diced into pieces and was sealed with an epoxy mold resin so that both surfaces of the filter chips were exposed, thus a semiconductor device of this embodiment was prepared.

The result of spectral sensitivity spectrum calculation on the thus obtained infrared light receiving element is illustrated in FIG. 15. The result obtained was comparable to that of the infrared light receiving element obtained in Example 3.

On the other hand, the device of Comparative Example 7 had a structure in which the sensor package and the filter package were assembled, and so was hardly reduced in size. The size of the IR sensor in Comparative Example 7 was 3.0 mm×3.0 mm×1.1 mm, thus the device height was approximately twice that in Example 3.

Comparative Example 8

A semiconductor wafer and an infrared light receiving element were obtained in the same manner as in Example 1 except that the thickness of the optical filter formed on the back surface of the compound semiconductor wafer was 3.9 µm as illustrated in FIG. 20.

The result of spectral sensitivity spectrum calculation on the thus obtained infrared light receiving element is illustrated in FIG. 11. In comparison with the infrared light receiving element obtained in Example 1, the peak sensitivity was lower by approximately 20% and the half width was narrower by 50% or more, thus the sensitivity to the $CO_2$ absorption band was reduced to even 40% or less.

Figure 18:
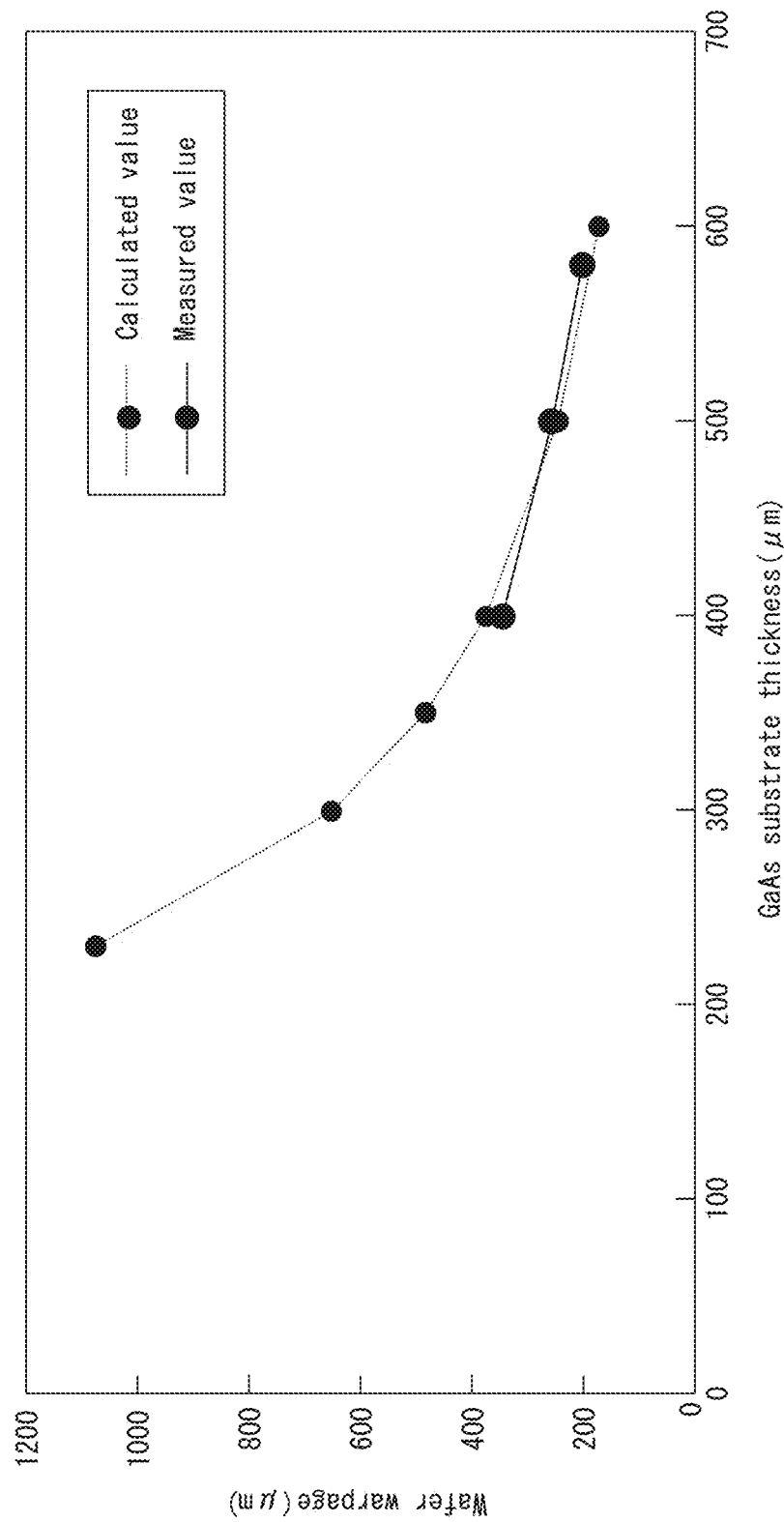
FIG. 18 is a diagram illustrating the relationship between the thickness $T_{waf}$ of a GaAs substrate and the wafer warpage.

FIG. 18 illustrates the relationship between the thickness of the GaAs substrate and the wafer warpage in the case of integrating an optical filter with a sensor wafer.

The values plotted as measured values were found by measuring the amount of wafer warpage, defined by the difference between the heights of the wafer center and the outermost wafer periphery. The thickness of a 4 inches-GaAs substrate in the wafer varied between 400 µm and 580 µm, and the thickness of the optical filter (material: SiO) was 14.3 µm.

On the other hand, the values plotted as calculated values were found by fitting performed in agreement with the measured values based on the known bimetal theory. In the fitting, literature data of the Young's modulus and the linear expansion coefficient of the material were used.

Figure 19:
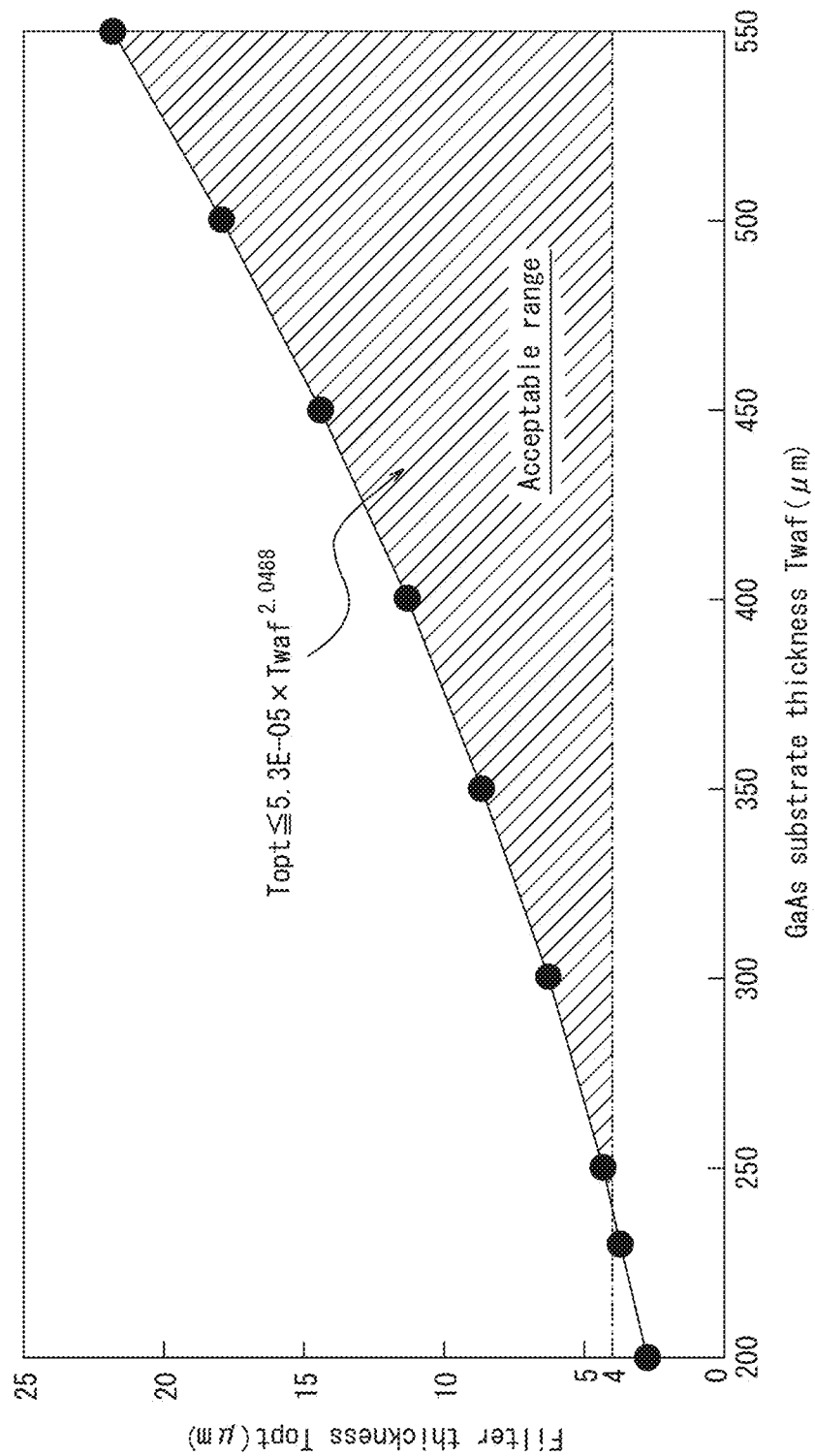
FIG. 19 is a diagram illustrating the acceptable thickness $T_{opt}$ of an optical filter relative to the thickness $T_{waf}$ or $T_{sub}$ of a GaAs substrate in terms of filter integration.

Next, using the calculation model, the relation between the thickness [µm] of the GaAs substrate and the filter thickness [µm] resulting in a wafer warpage of 300 µm or less was calculated and is illustrated in FIG. 19. The plot in FIG. 19 fitted using the least squares method demonstrated that the wafer warpage was 300 µm or less when the relation of $T_{opt} \leq 0.000053 \times T_{waf}^{2.0488}$ was satisfied. The results based on FIG. 18 and FIG. 19 are also true for a semiconductor device. Specifically, warpage can be reduced when the thickness $T_{sub}$ [µm] of the substrate and the thickness $T_{opt}$ [µm] of the optical filter satisfy the relation of $T_{opt} \leq 0.000053 \times T_{sub}^{2.0488}$, thus the internal stress of the semiconductor device can be sufficiently reduced.

The details of Examples are given in Table 1. Further, the details of Comparative Examples compared with Examples are given in Table 2.

TABLE 1

|  |  | Example 1 | Example 2 | Example 3 | Example 4 |
|---|---|---|---|---|---|
| Optical filter | Technique | Filter-integrated (Direct deposition) | Filter-integrated (Plasma bonding) | Filter-integrated (Direct deposition) | Filter-integrated (Plasma bonding) |

TABLE 1-continued

|  |  | Example 1 | Example 2 | Example 3 | Example 4 |
|---|---|---|---|---|---|
|  | First layer | SiO | SiO | SiO | ZnS |
|  | Second layer | Ge | Ge | Ge | Ge |
|  | Number of repetitions | 14.5 times | 14.5 times | 13.5 times | 21 times |
|  | Thickness $T_{opt}$ | 7.835 μm | 6.778 μm | 5.738 μm | 15.961 μm |
| Semi-conductor device | Sensitivity/intensity spectrum | FIG. 11 | FIG. 13 | FIG. 15 | FIG. 17 |
|  | Material of interlayer | — | Si 150 μm | — | Si 150 μm |
|  | PKG size | 3.0 mm × 3.0 mm × 0.52 mm | 3.0 mm × 3.0 mm × 0.52 mm | 3.0 mm × 3.0 mm × 0.52 mm | 3.0 mm × 3.0 mm × 0.52 mm |
|  | Type of device | Light receiving element | Light emitting element | Light receiving element | Light receiving element |
|  | Substrate | GaAs 350 μm | GaAs 200 μm | GaAs 300 μm | GaAs 200 μm |
|  | Semiconductor layer of first conductivity type | InSb | InSb | InSb | InSb |
|  | Semiconductor layer of first conductivity type | AlInSb | AlInSb | AlInSb | InSb |
|  | Barrier layer | $Al_{0.22}In_{0.78}Sb$ | $Al_{0.22}In_{0.78}Sb$ | $Al_{0.3}In_{0.7}Sb$ | — |
|  | Active layer | $Al_{0.04}In_{0.96}Sb$ | $Al_{0.04}In_{0.96}Sb$ | $Al_{0.09}In_{0.91}Sb$ | $Al_{0.14}In_{0.86}Sb$ |
|  | Barrier layer | $Al_{0.22}In_{0.78}Sb$ | $Al_{0.22}In_{0.78}Sb$ | $Al_{0.3}In_{0.7}Sb$ | $Al_{0.22}In_{0.78}Sb$ |
|  | Semiconductor layer of second conductivity type | AlInSb | AlInSb | AlInSb | InSb |

|  |  | Comparative Example 1 | Comparative Example 2 | Comparative Example 3 | Comparative Example 4 |
|---|---|---|---|---|---|
| Optical filter | Technique | No optical filter | No optical filter | No optical filter | No optical filter |
|  | First layer |  |  |  |  |
|  | Second layer |  |  |  |  |
|  | Number of repetitions |  |  |  |  |
|  | Thickness $T_{opt}$ |  |  |  |  |
| Semi-conductor device | Sensitivity/intensity spectrum | FIG. 11 | FIG. 13 | FIG. 15 | FIG. 17 |
|  | Material of interlayer | — | — | — | — |
|  | PKG size | 3.0 mm × 3.0 mm × 0.52 mm | 3.0 mm × 3.0 mm × 0.52 mm | 3.0 mm × 3.0 mm × 0.52 mm | 3.0 mm × 3.0 mm × 0.52 mm |
|  | Type of device | Light receiving element | Light emitting element | Light receiving element | Light receiving element |
|  | Substrate | GaAs 350 μm | GaAs 200 μm | GaAs 300 μm | GaAs 200 μm |
|  | Semiconductor layer of first conductivity type | InSb | InSb | InSb | InSb |
|  | Semiconductor layer of first conductivity type | AlInSb | AlInSb | AlInSb | InSb |
|  | Barrier layer | $Al_{0.22}In_{0.78}Sb$ | $Al_{0.22}In_{0.78}Sb$ | $Al_{0.3}In_{0.7}Sb$ | — |
|  | Active layer | $Al_{0.04}In_{0.96}Sb$ | $Al_{0.04}In_{0.96}Sb$ | $Al_{0.09}In_{0.91}Sb$ | $Al_{0.14}In_{0.86}Sb$ |
|  | Barrier layer | $Al_{0.22}In_{0.78}Sb$ | $Al_{0.22}In_{0.78}Sb$ | $Al_{0.3}In_{0.7}Sb$ | $Al_{0.22}In_{0.78}Sb$ |
|  | Semiconductor layer of second conductivity type | AlInSb | AlInSb | AlInSb | InSb |

|  |  | Comparative Example 5 | Comparative Example 6 | Comparative Example 7 | Comparative Example 8 |
|---|---|---|---|---|---|
| Optical filter | Technique | Sensor PKG + filter PKG | LED PKG + filter PKG | Sensor PKG + filter PKG | Filter-integrated (Direct deposition) |
|  | First layer | SiO | SiO | SiO | SiO |
|  | Second layer | Ge | Ge | Ge | Ge |
|  | Number of repetitions | 40 times or more | 40 times or more | 40 times or more | 7.5 times |
|  | Thickness $T_{opt}$ | 20 μm or more | 20 μm or more | 20 μm or more | 3.906 μm |
| Semi-conductor device | Sensitivity/intensity spectrum | FIG. 11 | FIG. 13 | FIG. 15 | FIG. 11 |
|  | Material of interlayer | — | — | — | — |
|  | PKG size | 3.0 mm × 3.0 mm × 1.1 mm | 3.0 mm × 3.0 mm × 1.1 mm | 3.0 mm × 3.0 mm × 1.1 mm | 3.0 mm × 3.0 mm × 0.52 mm |
|  | Type of device | Light receiving element | Light emitting element | Light receiving element | Light receiving element |
|  | Substrate | GaAs 350 μm | GaAs 200 μm | GaAs 300 μm | GaAs 350 μm |
|  | Semiconductor layer of first conductivity type | InSb | InSb | InSb | InSb |
|  | Semiconductor layer of first conductivity type | AlInSb | AlInSb | AlInSb | AlInSb |
|  | Barrier layer | $Al_{0.22}In_{0.78}Sb$ | $Al_{0.22}In_{0.78}Sb$ | $Al_{0.3}In_{0.7}Sb$ | $Al_{0.22}In_{0.78}Sb$ |
|  | Active layer | $Al_{0.04}In_{0.96}Sb$ | $Al_{0.04}In_{0.96}Sb$ | $Al_{0.09}In_{0.91}Sb$ | $Al_{0.04}In_{0.96}Sb$ |
|  | Barrier layer | $Al_{0.22}In_{0.78}Sb$ | $Al_{0.22}In_{0.78}Sb$ | $Al_{0.3}In_{0.7}Sb$ | $Al_{0.22}In_{0.78}Sb$ |
|  | Semiconductor layer of second conductivity type | AlInSb | AlInSb | AlInSb | AlInSb |

The present disclosure is not limited by the embodiments described above. Design modifications may be made to the embodiments based on the knowledge of those skilled in the art, and the embodiments to which such modifications have been made are included in the scope of the present disclosure.

The invention claimed is:

1. A semiconductor wafer comprising:
   a wafer substrate;
   a semiconductor stacked portion formed on a first surface of the wafer substrate, the semiconductor stacked portion being capable of one of emitting and receiving infrared light of 2 μm to 10 μm; and
   an optical filter formed on a second surface of the wafer substrate that is opposite to the first surface of the wafer substrate,
   wherein a thickness $T_{waf}$ [μm] of the wafer substrate and a thickness $T_{opt}$ [μm] of the optical filter satisfy a relation of $T_{opt} \leq 0.000053 \times T_{waf}^{2.0488}$.

2. The semiconductor wafer according to claim 1, wherein the thickness $T_{waf}$ of the wafer substrate is 150 μm to 600 μm.

3. The semiconductor wafer according to claim 1, wherein the thickness $T_{opt}$ of the optical filter is 4 μm to 26 μm.

4. The semiconductor wafer according to claim 1, wherein an active layer in the semiconductor stacked portion is one of $Al_xIn_{1-x}Sb$ (0≤x≤0.20), $InAs_ySb_{1-y}$ (0.10≤y≤0.20), and $InAs_ySb_{1-y}$ (0.75≤y≤1).

5. The semiconductor wafer according to claim 1, wherein the optical filter has a first layer having a refractive index of 1.2 or more and 2.5 or less with respect to infrared light with a wavelength of 2.4 μm or more and 6 μm or less and a second layer having a refractive index of 2 or more and 4.2 or less with respect to infrared light with a wavelength of 2.4 μm or more and 6 μm or less.

6. The semiconductor wafer according to claim 5, wherein the optical filter is formed by alternately stacking the first layer and the second layer twice or more and 25 times or fewer.

7. The semiconductor wafer according to claim 1, wherein the optical filter contains at least one of SiO, $SiO_2$, $TiO_2$, and ZnS.

8. The semiconductor wafer according to claim 1, wherein the optical filter contains at least one of Si and Ge.

9. The semiconductor wafer according to claim 1, wherein an amount of wafer warpage that is defined by a difference between a height of a wafer center and a height of an outermost wafer periphery is 300 μm or less.

10. The semiconductor wafer according to claim 1, wherein a diameter of the wafer substrate is 2 inches or more and 8 inches or less.

11. The semiconductor wafer according to claim 1, wherein an area of the wafer substrate and an area of the optical filter in plan view are approximately the same.

12. A semiconductor device comprising:
    a substrate;
    a semiconductor stacked portion formed on a first surface of the substrate, the semiconductor stacked portion being capable of one of emitting and receiving infrared light of 2 μm to 10 μm;
    an optical filter formed on a second surface of the substrate that is opposite to the first surface of the substrate; and
    a sealed portion in which the substrate, the semiconductor stacked portion, and the optical filter are sealed so that at least part of the optical filter is exposed,
    wherein a thickness $T_{sub}$ [μm] of the substrate and a thickness $T_{opt}$ [μm] of the optical filter satisfy a relation of $T_{opt} \leq 0.000053 \times T_{sub}^{2.0488}$.

13. The semiconductor device according to claim 12, wherein the thickness $T_{sub}$ of the substrate is 150 μm to 600 μm.

14. The semiconductor device according to claim 12, wherein the thickness $T_{opt}$ of the optical filter is 1.5 μm to 26 μm.

15. The semiconductor device according to claim 12, wherein an area of the substrate and an area of the optical filter in plan view are approximately the same.

16. A gas concentration measuring device comprising:
    a light emitting unit outputting infrared light absorbed by a gas to be detected;
    a gas cell into which the gas to be detected is introduced; and
    a light receiving unit that receives infrared light having been outputted from the light emitting unit and transmitted through the gas cell, and outputs a signal depending on an amount of the received infrared light,
    wherein at least one of the light emitting unit and the light receiving unit is the semiconductor device according to claim 12.

* * * * *